(12) United States Patent
Kingsley et al.

(10) Patent No.: US 8,664,624 B2
(45) Date of Patent: Mar. 4, 2014

(54) ILLUMINATION DELIVERY SYSTEM FOR GENERATING SUSTAINED SECONDARY EMISSION

(71) Applicant: Performance Indicator, LLC, Lowell, MA (US)

(72) Inventors: Edward D. Kingsley, Stow, MA (US); M. Glenn Homer, West Roxbury, MA (US); Satish Agrawal, Concord, MA (US); Louis Cincotta, Andover, MA (US)

(73) Assignee: Performance Indicator LLC, Lowell, MA (US)

( * ) Notice: Subject to any disclaimer, the term of this patent is extended or adjusted under 35 U.S.C. 154(b) by 0 days.

(21) Appl. No.: 13/676,161

(22) Filed: Nov. 14, 2012

(65) Prior Publication Data

US 2013/0088853 A1    Apr. 11, 2013

Related U.S. Application Data

(63) Continuation-in-part of application No. 13/249,350, filed on Sep. 30, 2011, now Pat. No. 8,415,642.

(60) Provisional application No. 61/388,040, filed on Sep. 30, 2010.

(51) Int. Cl.
*G01N 21/64* (2006.01)
*F21V 9/16* (2006.01)

(52) U.S. Cl.
CPC .................................. *F21V 9/16* (2013.01)
USPC ....................................................... 250/459.1

(58) Field of Classification Search
CPC ............................... F21V 9/16; H01L 51/50
USPC ............................................ 250/459.1, 458.1
See application file for complete search history.

(56) References Cited

U.S. PATENT DOCUMENTS

| | | | |
|---|---|---|---|
| 4,542,449 A | 9/1985 | Whitehead | |
| 4,791,540 A | 12/1988 | Dreyer, Jr. et al. | |
| 4,799,131 A | 1/1989 | Aho et al. | |
| 4,883,341 A | 11/1989 | Whitehead | |
| 4,984,144 A | 1/1991 | Cobb, Jr. et al. | |
| 6,117,362 A | 9/2000 | Yen et al. | |
| 6,267,911 B1 | 7/2001 | Yen et al. | |
| 6,537,829 B1 * | 3/2003 | Zarling et al. | 436/514 |
| 6,600,175 B1 | 7/2003 | Baretz et al. | |

(Continued)

FOREIGN PATENT DOCUMENTS

| | | |
|---|---|---|
| EP | 0725119 A1 | 8/1996 |
| EP | 1919000 A1 | 5/2008 |
| WO | 2006006544 A1 | 1/2006 |

OTHER PUBLICATIONS

Notification Concerning Transmittal of International Preliminary Report on Patentability, International Application No. PCT/US2011/054131, filed on Sep. 30, 2011.

(Continued)

*Primary Examiner* — Kiho Kim
(74) *Attorney, Agent, or Firm* — Cantor Colburn LLP

(57) ABSTRACT

An illumination delivery system for generating sustained secondary emission that includes at least an illumination source, a waveguide, and one or more energy conversion layers is disclosed. Also disclosed are methods of using the inventive illumination delivery system for generating sustained secondary emission.

40 Claims, 11 Drawing Sheets

(56) References Cited

U.S. PATENT DOCUMENTS

| | | |
|---|---|---|
| 7,070,300 B2 | 7/2006 | Harbers et al. |
| 7,151,283 B2 | 12/2006 | Reeh et al. |
| 7,639,916 B2 | 12/2009 | Fine |
| 8,128,272 B2 | 3/2012 | Fine et al. |
| 8,163,201 B2 | 4/2012 | Agrawal et al. |
| 2006/0255716 A1 | 11/2006 | Tsutsumi et al. |
| 2008/0231170 A1 | 9/2008 | Masato et al. |
| 2009/0257242 A1 | 10/2009 | Wendman |
| 2010/0303409 A1 | 12/2010 | Ku et al. |
| 2012/0155113 A1 | 6/2012 | Fine et al. |

OTHER PUBLICATIONS

Notification of Transmittal of the International Search Report and the Written Opinion of the International Searching Authority, or the Declaration, International Application No. PCT/US2011/054131, filed on Sep. 30, 2011.

Steven Allen, "Illumination for the 21st Century: High Efficiency Phosphor-Converted Light Emitting Diodes for Solid State Lighting", Thesis, 2007, University of Cincinnati.

Nobuaki Tanaka, et al., "Photodegradation of Polymer-Dispersed Perylene Di-imide Dyes", Applied Optics, 2006, 3846-51, vol. 45.

\* cited by examiner

ILLUMINATION DELIVERY SYSTEM FOR GENERATING SUSTAINED SECONDARY EMISSION

CROSS-REFERENCE TO RELATED APPLICATIONS

This application is a continuation-in-part of U.S. patent application Ser. No. 13/249,350 filed on Sep. 30, 2011, entitled "Photolytically and Environmentally Stable Multilayer Structure for High Efficiency Electromagnetic Energy Conversion and Sustained Secondary Emission," which in turn claims priority to U.S. Provisional Patent Application Ser. No. 61/388,040, filed Sep. 30, 2010 of the same title, each of which are incorporated by reference herein in their entirety for all purposes.

BACKGROUND

These teachings relate generally to electromagnetic radiation converting structures, and, more particularly, to the preparation and use of high quantum efficiency primary electromagnetic energy converting structures that are stable, and hence capable of providing sustainable secondary emissions, that is, for long durations at desired wavelengths.

Desirable electromagnetic emissions at specific wavelengths can be achieved by either designing the primary emitter to emit at the desired wavelength, such as, for example, different composition electroluminescent devices, or the primary emitter can emit at a primary wavelength that is shorter, often at a higher efficiency, which emission can then be down-converted to the desired longer wavelength by an energy converting element or material. For example, Photoluminescent Materials (e.g. High Persistence Phosphors, such as those disclosed in U.S. Pat. No. 6,117,362 (Blue), or in U.S. Pat. No. 6,267,911 (Green)), Electroluminescent Materials (e.g. UV or blue Light Emitting Diodes (LEDs), or lasers, etc.), Chemiluminescent Devices, etc., can emit at a shorter primary emission wavelength, which emission can be down-converted to desired secondary emissions having longer wavelengths.

Applications of fluorescent dye-based energy converting compositions are cited in U.S. patent application Ser. No. 11/793,376, filed on Dec. 20, 2005, for down-converting primary emissions of high-persistence phosphors to other longer-wavelength visible emissions. Therein the fluorescent dye-based energy conversion structures are rendered as films which embody both the primary emission source (a High Persistence Phosphor), and the energy conversion element in a multilayer film element, such film structures having the flexibility to be applicable to any object.

Use of short-persistence phosphorescent materials are cited in U.S. Pat. No. 7,151,283 for down-converting UV, blue or green LED, primary emissions into secondary emissions at desirable wavelengths, such as, for example, white light. Therein the phosphorescent conversion element is located within the solid state device.

Uses of organic fluorescent materials for down-converting shorter wavelength radiation emitted by UV, blue, or green LEDs to desired longer wavelength radiation are cited in U.S. Pat. No. 6,600,175. Therein also the fluorescent-dye conversion element is located within the solid state device.

Uses of fluorescent materials for down-converting primary emission from UV, or blue, or green LEDs, are also cited in "High Efficiency Phosphor-Converted Light Emitting Diodes for Solid State Lighting" by Steven Allen, Ph.D. Thesis, Univ. of Cincinnati. For the devices proposed in the latter citation the fluorescent organic fluorescent dye-based conversion element is located outside the LED solid state device.

High-Persistence inorganic phosphorescent material based products can be seen in airplanes, multistoried buildings, institutions, etc. Such products do not use any energy conversion elements, and emit at their primary emission wavelengths that are located in the blue (~490 nm) or green (~515 nm) areas of the visible spectrum. Remarkably, in spite of the availability of a broad class of high quantum efficiency organic fluorescent materials that can be used as energy conversion elements to create other colors, such products are not found in the marketplace. Apart from the desirability of having photo-luminescent products emitting in other colors (wavelengths) for aesthetical reasons, there is a need for other emission colors for serving informational purposes. An example is a position and hold bar (stripe) at airports, where both the daytime and nighttime (emissive) colors of such a marking need to be in the yellow region of the visible spectrum.

In the world of semiconductor based electroluminescent devices, such as LEDs, there has been a big push to create white light emitting LEDs. This is generally accomplished by utilizing a UV or blue primary emission LED and down-converting their primary emission into white light with an energy conversion element that is an inorganic short-persistence phosphorescent material, such as cerium doped yttrium aluminate. The inorganic phosphorescent energy conversion element is located inside the solid state device. Inorganic phosphorescent materials, such as cerium doped yttrium aluminate, are generally photolytically stable and hence are capable of providing sustainable emissions over a long lifetime. Although other phosphorescent materials are known, which either alone or in combination are capable of down-converting to other colors, their use has not gained wide acceptance in the marketplace. This is because high efficiency materials that can generate the wide range of colors are not available. Similarly, the spectrum of whites from cool white to warm white cannot be created.

Even though the down-converting properties of organic fluorescent materials have been known for some time, the use of such materials as energy conversion elements has been precluded by their inability to provide sustainable secondary emissions over long periods of time, for either outdoor applications using phosphorescent materials as the primary radiation, or for applications using LEDs or lasers as primary radiation. This is because so far the conversion elements have not been photolytically or thermally stable over the long time horizons required for commercial applications.

Multilayer film structures, such as those cited in U.S. patent application Ser. No. 11/793,376, filed on Dec. 20, 2005, can be deployed in a manner wherein the primary emission source, such as the high persistence phosphorescent material, can be located within the film structure, either as a separate layer or within the same layer wherein the organic fluorescence conversion element is located. However, testing reveals that the structures cited do not have long term stability, either for multiple year outdoor usage or for sustainable emissions for lifetimes that are generally desired for solid state devices.

Similarly, fluorescent organic energy conversion elements, such as those cited in U.S. Pat. No. 6,600,175, wherein the conversion element is located within a solid state device, are not capable of sustained emission over the lifetime that is generally required for solid state devices due to degradation of the conversion elements. It should be noted that inside the LED both the light intensity and temperatures are high (temperatures typically exceed 100° C. and can reach 150° C.), thereby accelerating both photolytic and thermal degradation of the organic fluorescent energy conversion elements.

Locating the conversion element remotely from the solid state device, such as an LED, will generally result in its experiencing a lower operating temperature. This may benefit emission sustainability by retarding the rate of degradation of the material. Nevertheless, even with remote location, the organic fluorescent energy conversion element is not capable of sustained emission over lifetimes typically required of solid state devices due to degradation. Remote location of the energy conversion element would also permit greater form factor flexibility by facilitating creation of different form factor lighting devices. Thus, depending upon the application, whether the film based energy conversion elements are located within or remotely from the solid state device, it would be beneficial to have a film based energy conversion structures that allow for sustained emissions.

Fluorescent or phosphorescent conversion elements, such as those cited above, are Lambertian emitters and therefore emit light in all directions. Since the emissions are generally viewed from one direction, it can be appreciated that it would be beneficial to redirect the emitted light towards the viewer. In cases where the film-based energy conversion structures are exposed to the environment, it would also be beneficial to provide clear protective layers for protecting the energy conversion materials from the environment.

Today's white light LEDs utilize inorganic phosphorescent materials that are specific for energy conversion of primary radiation (typically blue or UV) to white light. The use of fluorescent energy conversion elements, such as organic fluorescent dyes, has the potential to increase the conversion efficiency compared to that achieved with phosphorescent materials. Even with the incentive for attaining higher energy conversion efficiency, the use of fluorescent dye-based conversion elements has been precluded for generating sustained emission because of instability of these energy conversion elements, that is, sustained emissions cannot be achieved.

There is, therefore, a need for utilizing higher quantum efficiency energy conversion elements, such as organic fluorescent dyes, that are rendered in structures which are stable and capable of sustained emissions over the lifetimes desired for various applications. It is also desirable, therefore, to provide for energy conversion elements rendered as multilayer structures, wherein the structure not only embodies elements for achieving the high efficiencies in converting the primary emission, but also embodies elements that can substantially increase both photolytic and thermal stability of energy conversion elements, so as to enable sustained emissions over long periods of time. Furthermore, it is also desirable to incorporate within these structures layers that provide the means to direct the Lambertian emissions forward from the conversion elements into the hemisphere from which the emissions will be viewed, as well as protect the conversion elements, both physically (abrasion, etc.) and chemically (solvents, moisture, etc.), from the environment.

Energy conversion elements that provide sustained emission over long periods of time can have substantial utility in a number of different areas, such as in conjunction with primary emissions emanating from short or long persistence phosphors, electroluminescent devices, such as fluorescent tubes, LEDs, lasers, chemo-luminescent devices, LCDs etc. Such elements can be used not only for providing illumination in consumer and industrial applications, but also for displays. Furthermore, these energy conversion elements can also be used for authentication of items such as, credit cards, identification cards, transit passes or any item requiring authentication. There is a need for utilizing these energy conversion elements that are rendered in multilayer structures in order to provide unique charging/discharging and emission characteristics that can be tailored at the site of manufacture and that are difficult to counterfeit.

SUMMARY

The present teachings provide for a multilayer structure for sustained energy conversion of a primary electromagnetic radiation. The multilayer structure comprises an energy conversion layer which converts the energy of the primary electromagnetic radiation. The energy conversion layer comprises a polymer and a first photoluminescent material. The first photoluminescent material is characterized by a first Stokes shift and a first radiation absorption spectrum. The first radiation absorption spectrum at least partially overlaps with the spectrum of the primary electromagnetic radiation. Typically in the energy conversion layer, successive energy conversion occurs through successive energy conversion materials that are characterized by overlapping emission and absorption spectra. It is not required in all instances to cascade energy through a series of emission and reabsorption steps, and one may achieve the resultant energy conversion by way of Förster transfer. The multilayer structure further comprises at least one stability enhancement layer. The stability enhancement layer increases the photolytic and thermal stability of the energy conversion layer. The polymer in the energy conversion layer of the multilayer structure of the present teachings is selected to be photolytically and thermally stable. In certain constructions, the function provided by the stability enhancement layer can be incorporated within the energy conversion layer itself. The multilayer structure of the present teachings may also comprise a selective reflection layer which redirects radiation emitted in the energy conversion layer, for example in the direction where in may be perceived. The reflection layer, where applicable, is also capable of transmitting at least a portion of the primary electromagnetic radiation. The multilayer structure of the present teachings may additionally comprise a diffusion layer that increases the optical scattering of the pumping radiation and/or the emitted radiation in the energy conversion layer. The multilayer structure of the present teachings may also comprise a protective layer which provides mechanical and chemical durability for the multilayer structure. The protective layer may also include phase change materials to lower the operating temperature of the multilayer structure, thereby enhancing the durability of the multilayer structure. The primary electromagnetic radiation may emanate from within the multilayer structure itself. For example, the energy conversion layer may further comprise a high persistence photoluminescent material and the primary electromagnetic radiation may emanate from this high persistence photoluminescent material. In another aspect, the multilayer structure may further comprise at least one electroluminescent layer, such as an organic light emitting diode, and the primary electromagnetic radiation may emanate from this electroluminescent layer. In another aspect, the multilayer structure may further comprise at least one electroluminescent phosphor from which the primary electromagnetic radiation may emanate. In another aspect, the multilayer structure may further comprise at least one chemiluminescent layer, from which the primary electromagnetic radiation may emanate. Alternatively, either ambient light can provide the primary electromagnetic radiation or the primary electromagnetic radiation may emanate from an electroluminescent source, or from a solid state device, or from a chemiluminescent source. The first photoluminescent material of the energy conversion later may comprise an organic fluorescent dye. The multilayer structure of the present teachings may further comprise a second photoluminescent material. The second photoluminescent material is characterized by a second Stokes shift and a second radiation absorption spectrum. The second radiation absorption spectrum at least partially overlaps with the spectrum of the radiation emission of the first photoluminescent material.

The present teachings also provide for a method for sustained energy conversion of a primary electromagnetic radiation. The method of the present teachings comprises providing a multilayer structure for sustained energy conversion of a primary electromagnetic radiation. The multilayer structure comprises an energy conversion layer which converts the energy of the primary electromagnetic radiation. The energy conversion layer comprises a polymer and a first photoluminescent material which is characterized by a first Stokes shift and a first radiation absorption spectrum. The first radiation absorption spectrum at least partially overlaps with the spectrum of the primary electromagnetic radiation. Typically in the energy conversion layer, successive energy conversion occurs through successive energy conversion materials that are characterized by overlapping emission and absorption spectra. It is not required in all instances to cascade energy through a series of emission and reabsorption steps, and one may achieve the resultant energy conversion by way of Förster transfer. The multilayer structure further comprises at least one stability enhancement layer which increases the photolytic and thermal stability of the energy conversion layer. The multilayer structure may further comprise a reflection layer which redirects radiation emitted in the energy conversion layer, for example in the direction where in may be perceived. The multilayer structure may also further comprise a diffusion layer which increases the optical scattering of the pumping radiation and/or the emitted radiation in the energy conversion layer. The multilayer may also comprise a protective layer to enhance durability of at least the energy conversion layer. The method of the present teachings further comprises exposing the energy conversion layer to the primary radiation source. The method further comprises converting energy from the primary radiation source to a longer output wavelength. The source of the primary electromagnetic radiation of the method may be provided within the multilayer structure itself. Alternatively, the source could be located remotely. For example, ambient light could also serve as the primary electromagnetic radiation. In other examples, the primary electromagnetic radiation may be provided from an electroluminescent source, or form a solid state device, or from a chemiluminescent source. To provide the source of the primary electromagnetic radiation, the multilayer structure may be placed inside or in close proximity to a solid state device.

The present teachings further provide for a method of forming a multilayer structure for sustained energy conversion of a primary electromagnetic radiation. The method comprises forming an energy conversion layer comprising a first photoluminescent material which is characterized by a first Stokes shift and a first radiation absorption spectrum. The first radiation absorption spectrum overlaps with the spectrum of the primary electromagnetic radiation. Typically in the energy conversion layer, successive energy conversion occurs through successive energy conversion materials that are characterized by overlapping emission and absorption spectra. It is not required in all instances to cascade energy through a series of emission and reabsorption steps, and one may achieve the resultant energy conversion by way of Förster transfer. The method further comprises overlaying at least one stability enhancing layer and, optionally, a protective layer over the energy conversion layer. The stability enhancing layer, or layers, increases the photolytic and thermal stability of the energy conversion layer, and the protective layer protects the multilayer film structure physically and chemically. The method may further comprise applying a reflection layer to the energy conversion layer to redirect radiation emitted in energy conversion layer. The method may additionally comprise applying a diffusion layer to the energy conversion layer to increase the optical scattering of the pumping radiation and/or the emitted radiation in the energy conversion layer.

The present teachings also provide for an illumination delivery system for generating sustained secondary emission. The illumination delivery system comprises an illumination source, a waveguide, and one or more energy conversion layers. The illumination source emits a primary electromagnetic radiation, which is received and propagated by way of the waveguide. The waveguide further transmits at least a portion of the primary electromagnetic radiation to that of the one or more energy conversion layers. The one or more energy conversion layers, comprising a polymer and one or more fluorescent materials having an absorption spectrum that at least partially overlaps with the primary electromagnetic radiation, convert at least a portion of the primary electromagnetic radiation to a longer output wavelength.

The present teachings further provide for a method for generating sustained secondary emission. The method of the present teachings comprises providing an illumination delivery system for generating sustained secondary emission. The illumination delivery system comprises an illumination source that emits a primary electromagnetic radiation, a waveguide that receives and propagates such primary electromagnetic radiation, and one or more energy conversion layers comprising a polymer and one or more fluorescent materials having an absorption spectrum that at least partially overlaps with the primary electromagnetic radiation. The waveguide further transmits at least a portion of the primary electromagnetic radiation emitted from the illumination source to that of the one or more energy conversion layers, such that the one or more energy conversion layers subsequently convert at least a portion of the primary electromagnetic radiation to a longer output wavelength.

BRIEF DESCRIPTION OF THE DRAWINGS

The present teachings are illustratively shown and described in reference to the accompanying drawings, in which.

Figure 4:
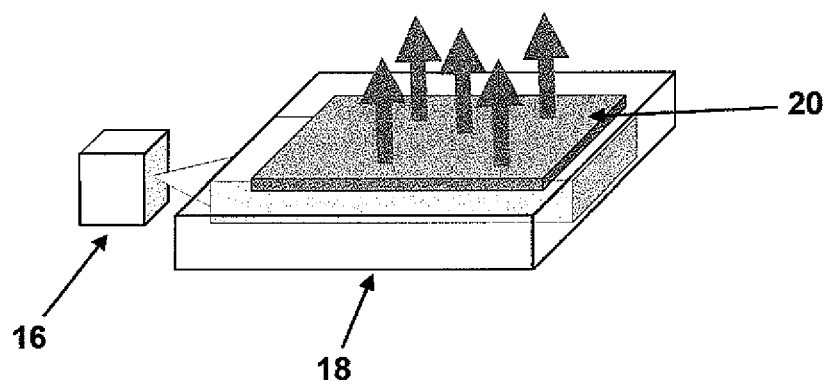
Figure 5:
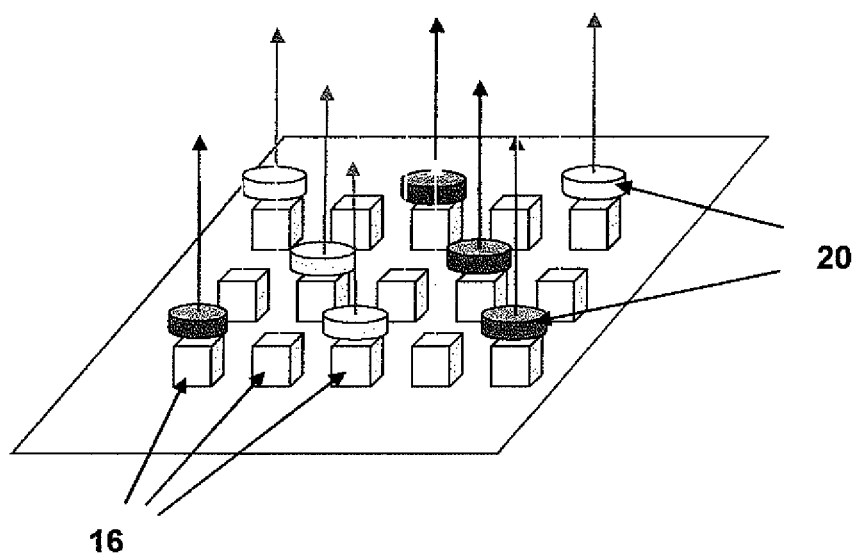
Figure 6:
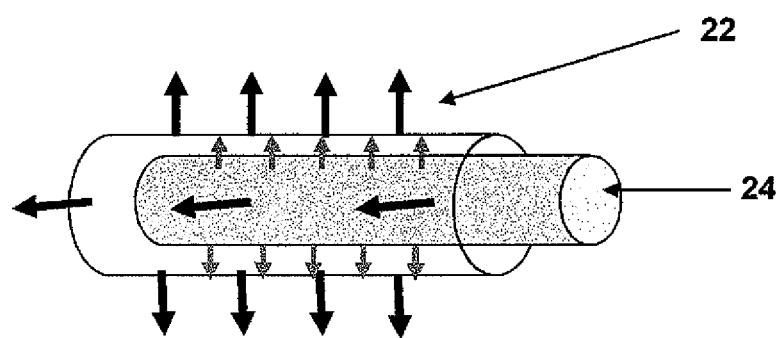
Figure 7:
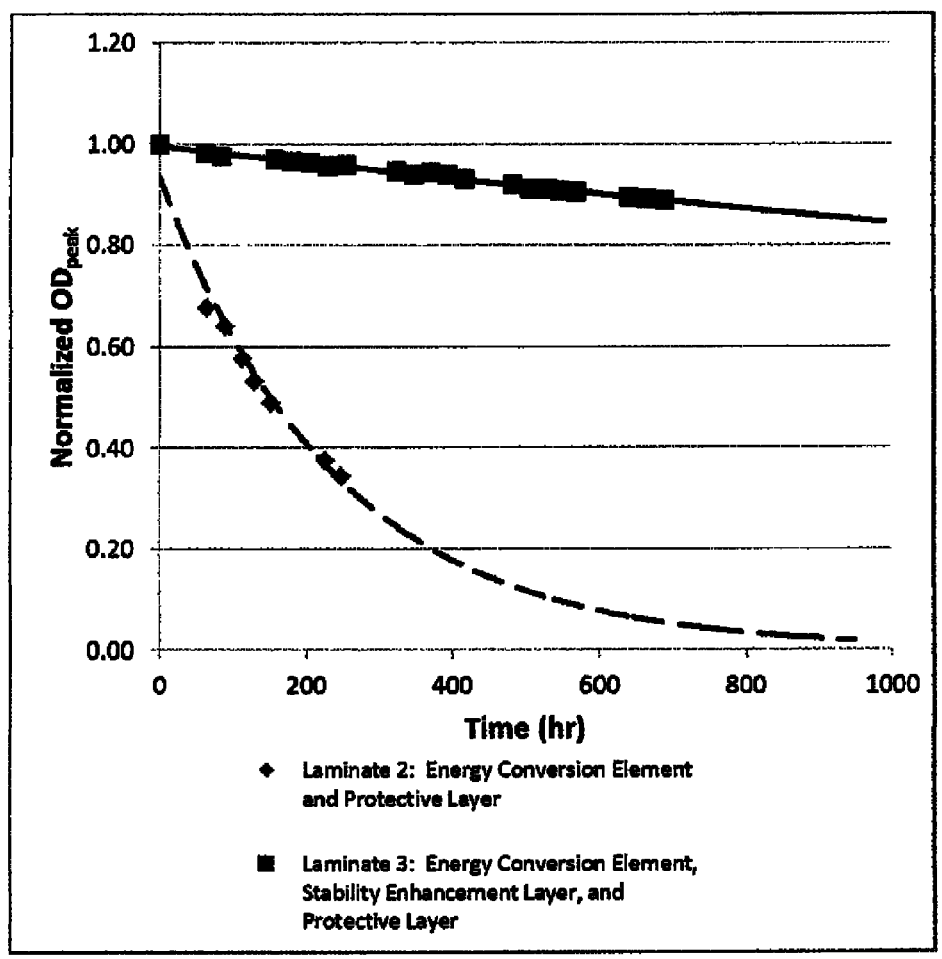
Figure 8:
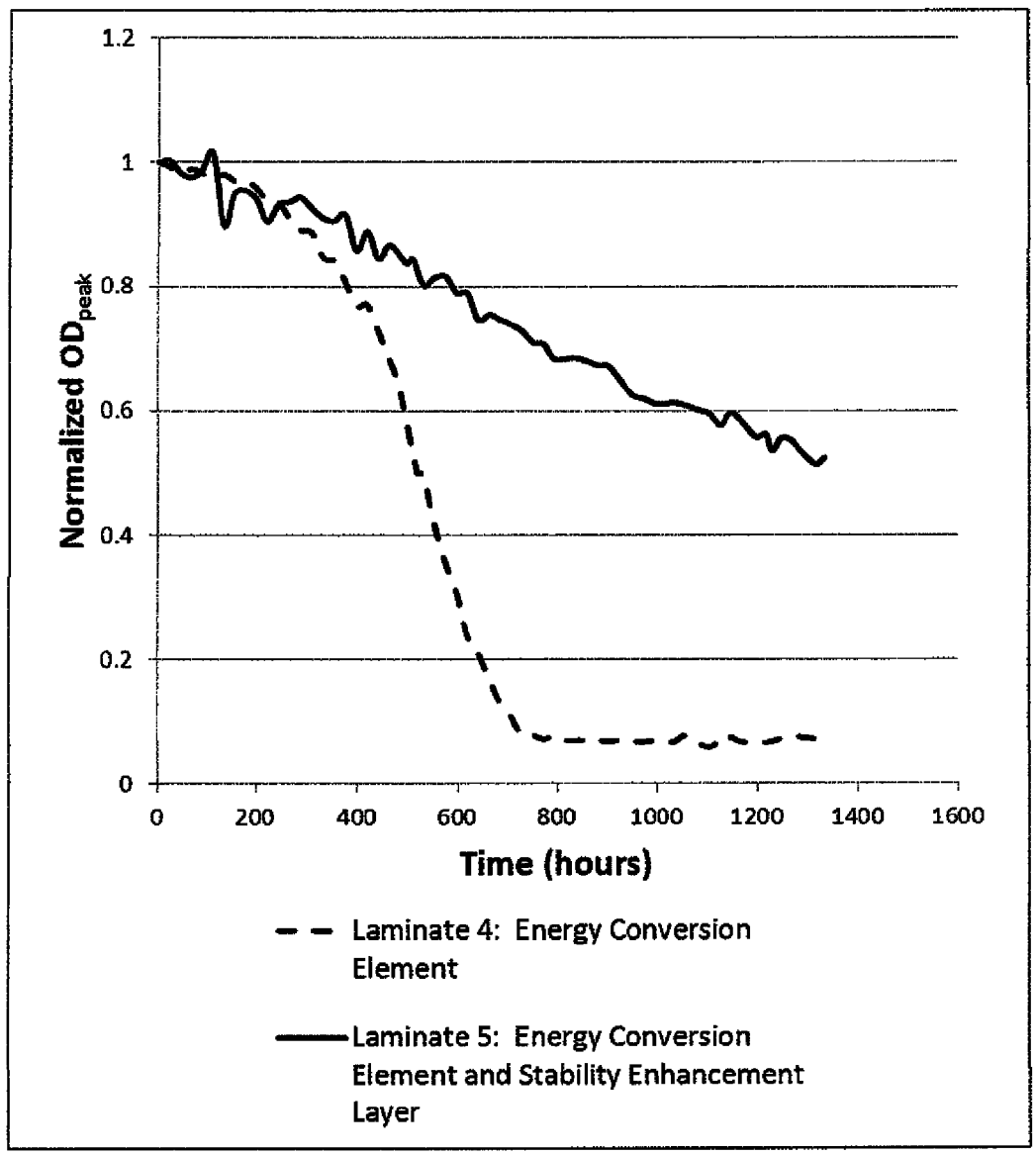
Figure 9:
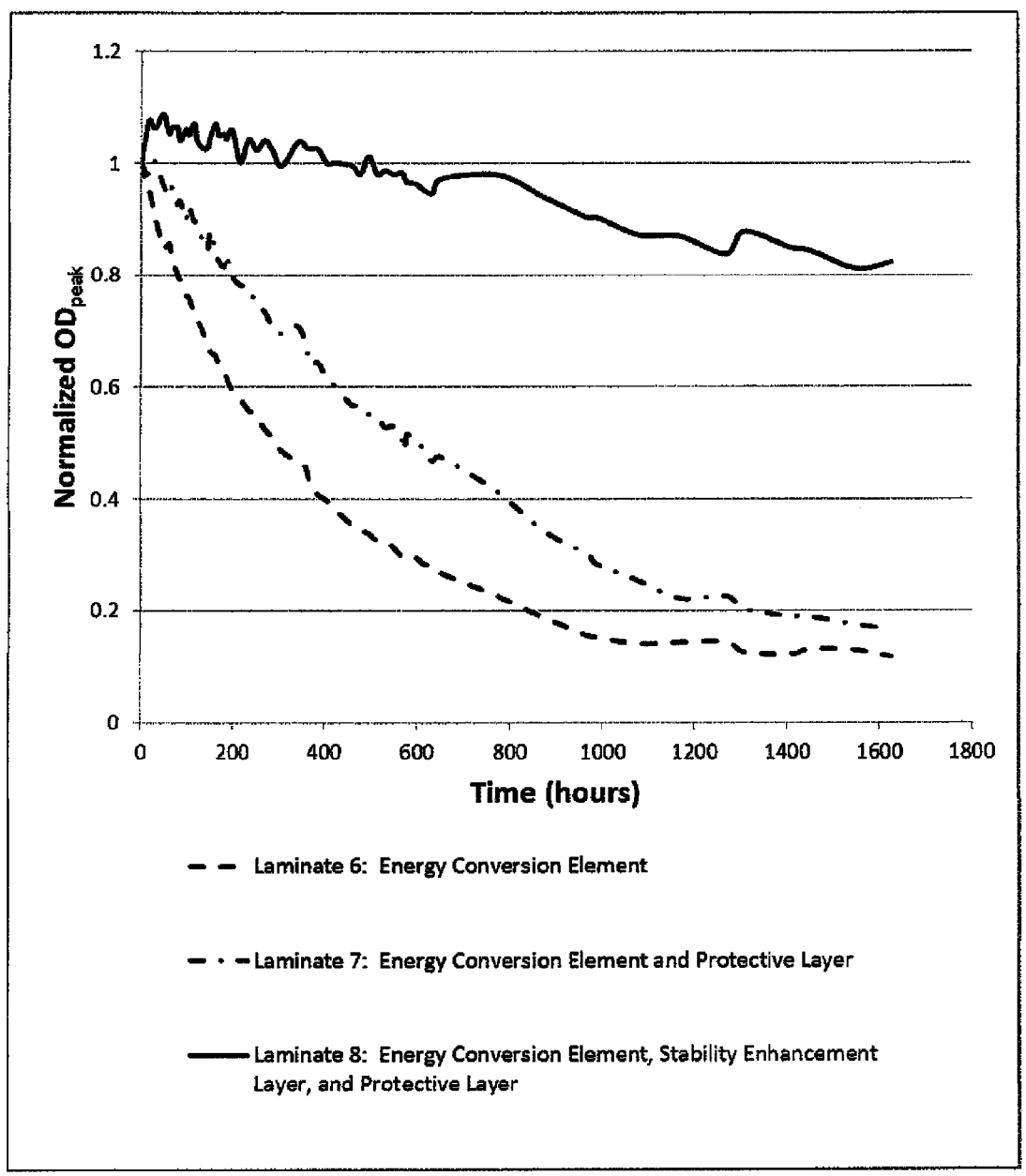
Figure 10:
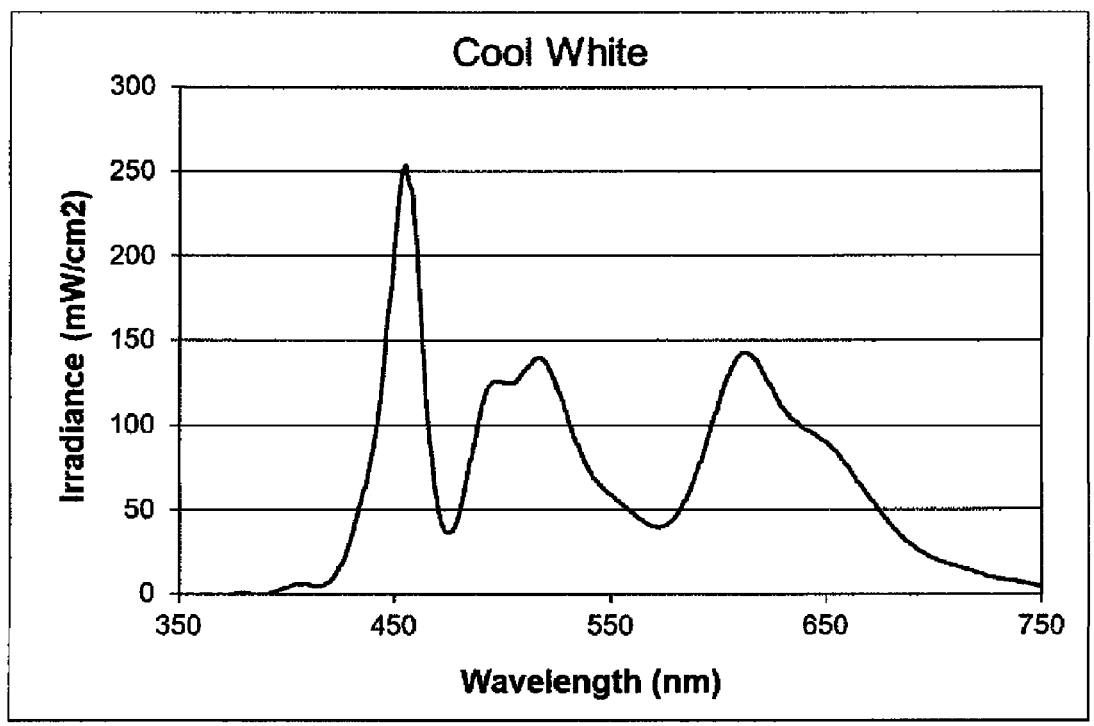
Figure 11:
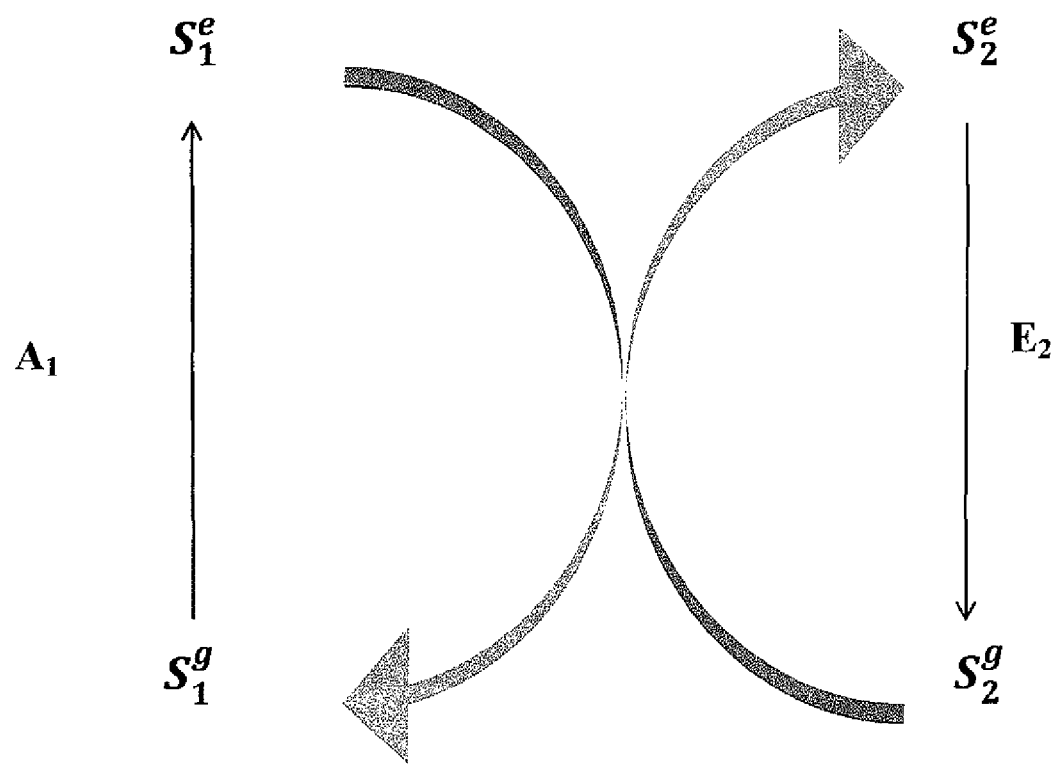

(m) Core Layer with Reflection Layer and ECL; (n) Core Layer with Reflection Layer, ECL, and Stability Enhancement Layer; (o) Core Layer with Reflection Layer, ECL, Stability Enhancement Layer, and Protective Layer; (p) Core Layer with Reflection Layer, ECL, and Protective Layer; (q) Core Layer with Reflection Layer, Diffusion Layer and ECL; (r) Core Layer with Reflection Layer, Diffusion Layer, ECL and Stability Enhancement Layer; (s) Core Layer with Reflection Layer, Diffusion Layer, ECL, Stability Enhancement Layer and Protective Layer; (t) Core Layer with Reflection Layer, Diffusion Layer, ECL and Protective Layer;

FIG. 4 is a diode-illuminated waveguide structure utilizing a multilayer energy converting structure according to these teachings;

FIG. 5 is a diode array utilizing multilayer energy converting structures according to these teachings;

FIG. 6 is a multilayer energy converting sleeve according to these teachings;

FIG. 7 is a graph illustrating the effects of using a protective layer with and without a stability enhancement layer on the degradation of photoluminescent materials;

FIG. 8 is a graph comparing the degradation of photoluminescent materials with and without the use of a stability enhancement layer;

FIG. 9 is a graph illustrating the effects of using a protective layer and a stability enhancement layer on the degradation of photoluminescent materials;

FIG. 10 shows the spectrum of a cool white emission generated from a film prepared according to these teachings; and FIG. 11 is a schematic that describes the energy transfer from one photoluminescent material to another by way of Förster transfer.

DETAILED DESCRIPTION

The present teachings are directed to the creation of photoluminescent, high quantum efficiency energy conversion structures with one or more layers rendered as cast, extruded, coated films, planar or otherwise, or single or multilayer particles comprising energy conversion elements with preference for such elements being organic fluorescent dye based structures that can convert primary radiation, or primary emissions of short wavelengths, such as those emitted by phosphorescent materials of high and low persistence, electroluminescent devices, such as LEDs, lasers, electro-luminescent devices based on short and long persistence phosphors, chemiluminescent devices, and the like, to longer wavelengths.

For a better understanding of the disclosure the following terms are herein defined:

The term "luminescence" is defined as the emission of electromagnetic radiation from any substance. Luminescence occurs from electronically excited states.

The electronic excited states of most organic molecules can be divided into singlet states and triplet states.

As used herein, the term "singlet state" refers to an electronic state wherein all electrons in the molecule are spin-paired.

As used herein, the term "triplet state" refers to an electronic state wherein one set of electron spins is unpaired.

The excited state is usually the first excited state. A molecule in a high vibrational level of the excited state will quickly fall to the lowest vibrational level of this state by losing energy to other molecules through collision. The molecule will also partition the excess energy to other possible modes of vibration and rotation.

"Luminescent materials" are those which exhibit luminescence, that is, emit electromagnetic radiation. Characterizing luminescent materials requires consideration of: (1) the excitation source, (2) the nature of the emission, and (3) whether or not additional stimulation is required to cause emission.

With regard to the excitation source, luminescent materials excited by electromagnetic radiation are referred to herein as "photoluminescent." Luminescent materials excited by electrical energy are referred to herein as "electroluminescent." Luminescent materials excited by a chemical reaction are referred to herein as "chemiluminescent."

With regard to the nature of the emission, this may be either fluorescence or phosphorescence. A "fluorescent" material stores electromagnetic radiation and releases it rapidly, generally in about $10^{-8}$ seconds or less, in a process that does not invoke a change in the electronic spin state of the molecule. Fluorescence from organic molecules typically occurs from excited singlet states. Contrarily, a "phosphorescent" material stores electromagnetic radiation and releases it gradually, in about $10^{-6}$ seconds or greater, in a process that requires a change in the electronic spin state of the molecule.

"Primary Radiation" refers to electromagnetic radiation of the shortest average wavelength from a luminescent element. Primary radiation generally needs to be converted into a radiation of a longer wavelength.

"Pumping Radiation" is a term used herein synonymously with "Primary Radiation".

"Primary Excitation" refers to electromagnetic radiation that excites a molecule from a lower energy state to a higher energy state. "Primary Excitation" may in some instances, be synonymous with "Primary Radiation".

"Energy conversion element" refers to a photoluminescent material capable of converting a primary radiation into a secondary radiation of a longer wavelength.

"Liquid carrier medium" is a liquid that acts as a carrier for materials distributed in a solid state and/or dissolved therein.

As used herein, a "formulation" is a liquid carrier medium, as defined above, comprising at least one polymer material either dissolved in and/or distributed in a solid state within said liquid carrier medium.

A "dispersion" is a formulation, as defined above, which additionally comprises a material that is a solid distributed in the liquid carrier medium.

A "solution" is a homogeneous mixture of at least two materials. A solution may be a formulation wherein an ingredient, such as a dye or a polymer, is dissolved in the liquid carrier medium, or a homogeneous mixture of a dye in a polymer.

A "solid state solution" of dye and polymer is a homogeneous mixture of the two in the dry state. One possible way of achieving that is the mixture resulting from applying a formulation comprising the said dye and polymer in solution in a liquid carrier and drying (removing solvent) the said dye and polymer solution. Such a homogeneous mixture may also result from subjecting a mixture of said dye and polymer to elevated temperatures. Note that for a homogeneous mixture to form in a dry state, the polymer and dye have to be compatible, otherwise a homogeneous mixture will not result.

A "photoluminescent formulation" is a formulation, as defined above, which comprises a photoluminescent material as defined above.

A "phosphorescent formulation" is a formulation, as defined above, which comprises a phosphorescent material as defined above.

A "fluorescent formulation" is a formulation, as defined above, which comprises a fluorescent material as defined above.

A "protective formulation" is a formulation, as defined above, wherein some or all of the polymeric resin and/or additional materials are selected for providing protection against photolytic degradation and/or for providing environmental or mechanical protection of the underlying article, upon application onto said article. The protective formulation may optionally comprise photostabilizers, such as UV absorbers, hindered amine light stabilizers (HALS), antioxidants, singlet oxygen scavengers, etc.

A "stabilizing additive" is a material added to a formulation comprising solid particles, or a dispersion, to uniformly distribute, prevent agglomeration, and/or prevent settling of solid materials in said dispersion in said liquid carrier medium to result in an enhancement of luminous intensity. Such stabilizing additives generally comprise dispersants and/or rheology modifiers.

A "preformed article" is any article onto which at least one layer which is photoluminescent or otherwise may be applied. A preformed article may be rigid or flexible.

A "film" is a thin skin or membrane that can be rigid or flexible. An example of this is the layer resulting from the application of a formulation and drying it. One or more layers can then constitute a film.

As used herein, "visible electromagnetic radiation" is characterized by electromagnetic radiation with wavelengths in the region between about 400 nanometers ("nm") and about 700 nm.

"Photolytic degradation" is deterioration or change in properties, such as observed color or luminescence characteristics, that is induced by electromagnetic radiation.

"Thermal degradation" is deterioration or change in properties that is induced by heat.

"Sustained emission" is emission of electromagnetic radiation at desired wavelengths for prolonged periods of time. Prolonged period of time duration has meaning within the context of the usage. For example, in outdoor usage with primary emission source embodied within the film element, this may mean one to several years of outdoor usage. Alternatively, for applications in solid state LEDs for converting primary emission to secondary emission of different colors, including white light, sustained emission implies lifetimes greater than 10,000 hours.

LED Lifetimes: The lifetime of light emitting diodes is defined by a combination of catastrophic failure rate and failure due to loss of lumen maintenance. For example a B10 value indicates the time by which 10% of a population has failed. Similarly, a failure criterion of L70 classifies as a failure any unit that has lost more than 30% of its light output. Therefore, a (B10, L70) lifetime is defined as that time by which 10% of a population has either failed catastrophically or has lost at least 30% of its light output.

An "excimer" is a short lived dimeric or heterodimeric molecule formed from two species at least one of which is in an electronic excited state.

The "glass transition temperature" is the temperature that identifies the transition of a polymer material from a rubbery state to a glass, and is characterized by a discontinuity in the variation of specific volume with temperature.

A "lenticule" as used herein, is one of a number of corrugations or grooves molded or embossed into a surface.

A "lenticular" lens is a lens made of an array of lenticules. A "lenticular film," as used herein, is a film having a surface on which a lenticular lens is formed.

A "prismatic lens," as used herein, is a lens incorporating a prescribed prism. A "microprismatic film," as used herein, is a film having an array of small prismatic lenses formed on a surface of the film. A microprismatic film can be, in one exemplary embodiment, but is not restricted to this exemplary embodiment, an array of micro Fresnel lenses.

"Optical Transmission," as used herein, is the fraction of visible primary electromagnetic radiation transmitted through a layer that does not have one or more photoluminescent materials.

The following disclosure describes the methods and the materials for creating stable photoluminescent multilayer electromagnetic energy conversion elements. These elements possess a number of superior qualities, such as ability to produce sustained emission, high energy conversion efficiency, minimized back scatter properties, energy conversion flexibility for tailoring secondary emission, and physical and chemical stability to environmental exposure.

Figure 1:
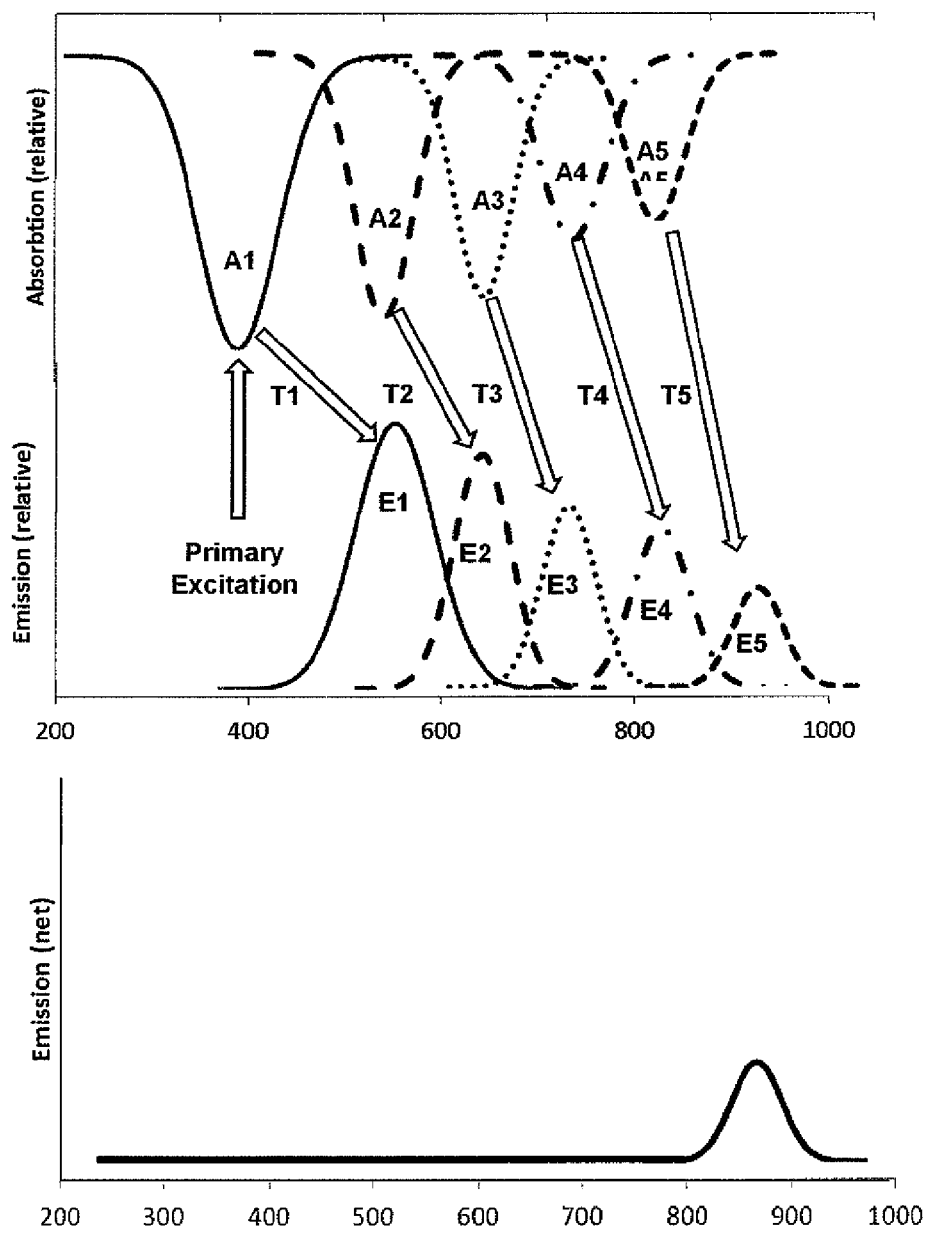
FIG. 1 is a schematic that describes the cascade of emission from one photoluminescent material to another.

In one aspect, the present teachings provide for a method for converting a primary electromagnetic radiation, or pumping radiation, into another, secondary electromagnetic radiation having a different spectrum, generally characterized by a higher average wavelength. The method of energy conversion of the present teachings is described with reference to FIG. 1. The source of excitation, can be electromagnetic radiation such as daylight or other ambient light, or electrical or chemical energy, and is represented in FIG. 1 with a solid upward arrow. For example, FIG. 1 can be understood to represent a case in which the pumping radiation E1 is the emission from a persistent phosphor that has been previously excited by external illumination into absorption band A1. FIG. 1 can also represent the case in which the pumping radiation E1 is provided by a chemiluminescent source, where A1 can be interpreted as the chemically generated excited state. FIG. 1 can also represent the case in which the pumping radiation E1 is provided by an electroluminescent source, where A1 can be interpreted as the emissive state in the electroluminescent device.

Figure 2A:
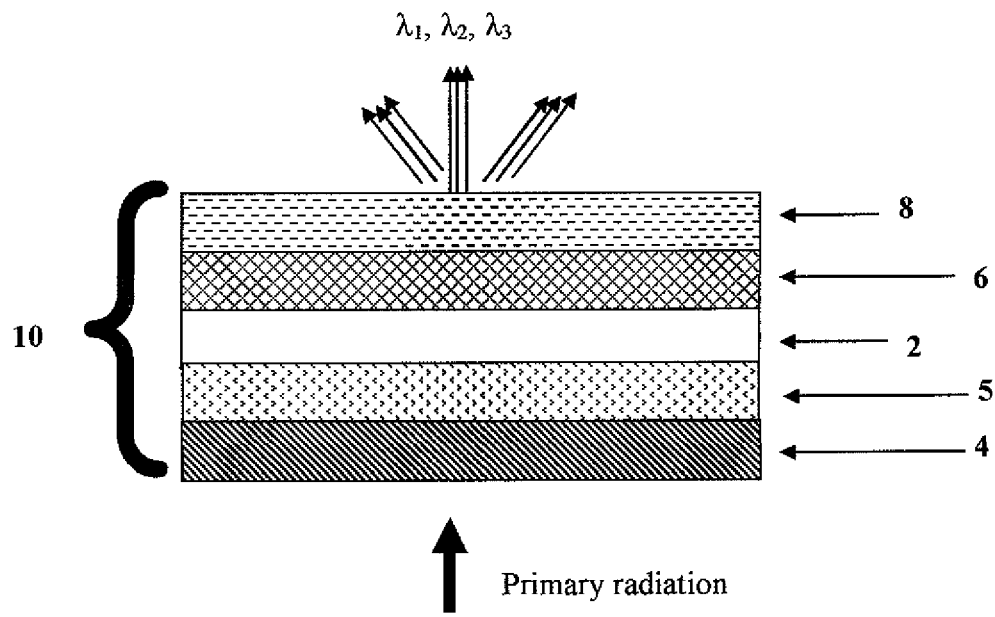
FIG. 2A is a schematic drawing of an energy converting structure according to one aspect of these teachings.
Figure 2B:
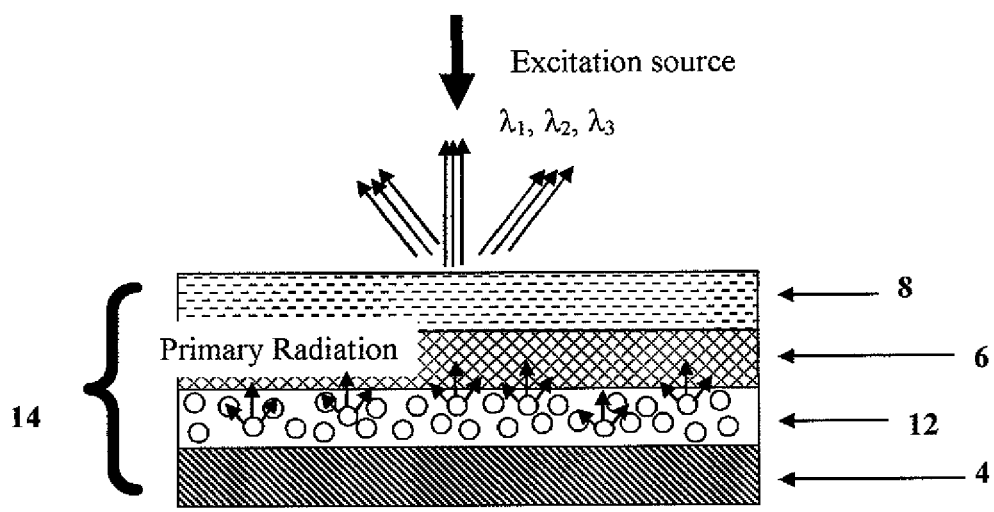
FIG. 2B is a schematic drawing of an energy converting structure according to a second aspect to these teachings.

The primary radiation or pumping energy, which originates from the excitation source may be provided by a radiation source that is embodied within the energy conversion element, such as a persistent phosphor, as is shown in FIG. 2B (Layer 12), that has been excited with sunlight, or with other external illumination. Alternatively, the pumping energy may be provided by a radiation source that is external to the energy conversion element, as is shown in FIG. 2A, such as a solid state device, for example an LED, a laser, or an electroluminescent element, etc. It should be noted that embodiments wherein the energy conversion element is within the solid state device, as well as embodiments wherein the radiation source is in proximity to the energy conversion element are within the scope of these teachings. In such alternative case, the excitation may arise from electrical energy that stimulates emission from the solid state device, or chemically, as in a chemiluminescent device.

With continued reference to FIG. 1, the electromagnetic energy spectrum of the principal electromagnetic radiation is converted by the method of the present teachings into a new radiation, having a spectrum generally of a higher average wavelength, through a cascade of absorption/emission events by one or a set of photoluminescent materials, for example organic fluorescent dyes. Each individual photoluminescent material is characterized by a radiation energy absorption spectrum $A_i$, a radiation energy emission spectrum $E_1$, and a characteristic time constant $T_i$ between radiation absorption and radiation emission (where $i=1, 2, 3 \ldots$). Preferably, some or all of the new electromagnetic radiation produced by the method of the present teachings is visible electromagnetic radiation.

Further referring to FIG. 1, in one aspect of the method of energy conversion of primary radiation in these teachings, essentially all of the primary electromagnetic radiation or pumping energy (characterized as E1 in FIG. 1) is absorbed by a first photoluminescent material characterized by energy absorption spectrum A2, energy emission spectrum E2 and a characteristic time constant T2 between energy absorption and energy emission. Generally, the average wavelength of radiation emission spectrum E2 is higher than the average wavelength of radiation absorption spectrum A2. This difference in wavelengths is referred to as the Stokes shift, and the energy corresponding to this difference in wavelengths is referred to as Stokes loss. The emission of the first photoluminescent material in the visible electromagnetic radiation spectrum can be allowed to escape, representing a new color which is not characteristic of the principal electromagnetic radiation.

Still referring to FIG. 1, in another aspect of the method for energy conversion of primary radiation in these teachings, a second photoluminescent material can be used to absorb the radiation emitted by the first material, that is, E2. The second photoluminescent material is characterized by energy absorption spectrum A3, energy emission spectrum E3 and a characteristic time constant T3 between energy absorption and energy emission. The radiation absorbed by the second material represents some or all of the radiation emitted by the first material. The second material emits radiation and exhibits a Stokes shift to a yet higher wavelength than the first material. Additional photoluminescent materials having appropriate Stokes shifts can be chosen to further convert the radiation until the desired emission wavelength is reached. These additional photoluminescent materials are characterized by radiation absorption spectra A4, A5, etc., radiation emission spectra, E4, A5, etc., and characteristic time constants between radiation absorption and radiation emission T4, T5, etc. In this manner, a principal electromagnetic radiation characterized by a blue color, for example, can be used to generate green, yellow, orange, or red light. Although, the film-based energy conversion elements can be phosphorescent or fluorescent photoluminescent materials, it is preferred in some applications to use fluorescent photoluminescent materials, such as organic fluorescent dyes, as the energy conversion materials.

While reabsorption of emitted radiation can be an effective mechanism for energy down-conversion, the transfer of energy does not require emission and reabsorption. Alternatively, the transfer of energy in energy down-conversion can occur through Förster transfer mechanism, as illustrated in FIG. 11. With reference to FIG. 11, $S_1^g$ represents the state of a first photoluminescent material before absorbing light, $S_1^e$ represents the state of the first photoluminescent material after absorbing light (the excited state), and $A_1$ represents the energy of the photon of light absorbed by the first photoluminescent material. Likewise, $S_2^g$ represents the non-excited state of a second photoluminescent material, $S_2^e$ represents the excited state of the second photoluminescent material, and $E_2$ represents the emission of light from the second photoluminescent material corresponding to the transition from its excited state back to its non-excited state. With continued reference to FIG. 11, the second photoluminescent material can be excited from $S_2^g$ to $S_2^e$ by transfer of energy from $S_1^e$ without the emission of luminescent energy from the first photoluminescent material. As a result, the emission $E_2$ is produced from direct excitation of the first photoluminescent material. Förster transfer can occur where the electronic characteristics of the emission of a first photoluminescent material and the absorption of a second photoluminescent material are properly chosen, such that the transfer of electronic energy can occur by dipolar coupling without requiring the emission of a photon by the first photoluminescent material. Förster transfer requires that the photoluminescent materials undergoing the transfer of the electronic energy be close enough to experience their respective dipolar fields. As a result, Förster transfer requires a significantly higher concentration of the second photoluminescent material than is conventionally used for energy cascade.

In another aspect of the method of energy conversion of primary radiation of the present teachings, only a portion of the principal electromagnetic radiation is converted by the first material in accordance with the foregoing disclosure to a radiation of a longer wavelength. All or a portion of the radiation that is emitted by the first material in combination with the remaining principal radiation will create the desired final emission. In yet another aspect, all or a portion of the first materials' radiation emission is similarly converted by the second material to produce a radiation emission of a still longer wavelength. In the foregoing manner, a broad spectrum of radiation emission can be attained, such that radiation emission of white color is observed, for example.

Another aspect of these teachings provide for an energy conversion structure rendered as a cast, coated, extruded film, generally comprising multiple layers, or single or multiple layer particles. The energy conversion film structure is described with reference to FIG. 2A and FIG. 2B.

Energy Conversion Layer: One of the layers of the structure provides the function of an energy conversion layer, which comprises one or more photoluminescent materials that enable converting a primary electromagnetic radiation into another electromagnetic radiation having a different spectrum, generally characterized by a higher average wavelength. The energy conversion elements can be phosphorescent or fluorescent photoluminescent materials, with the fluorescent energy conversion materials, such as organic fluorescent dyes, being preferred in some applications. The energy conversion layer comprises one or more photoluminescent materials which enable generating electromagnetic emission energy of one or more new wavelengths. Referring to FIG. 2A, the energy of the primary electromagnetic radiation, or pumping radiation, which is emitted by a radiation source that is external to the structure, which is represented with a solid upward arrow, is converted inside energy converting layer (2). In one aspect, the energy conversion layer (2) comprises a single layer incorporating one or a set of energy converting materials. In another aspect of the energy conversion layer, which may be preferred in some applications, the energy converting layer (2) comprises several energy converting layers of different composition, each composition comprising one or a subset of materials. The photoluminescent materials of the energy conversion layer (2) preferentially comprise organic fluorescent dye molecules.

In yet another aspect of the energy conversion structure of the present teachings illustrated in FIG. 2B, wherein the primary radiation source, such as a high persistence phosphor, is also embodied within the multilayer structure, such as, for example, within the energy converting layer (12), or in a separate layer (12*, not shown) below the energy conversion layer. According to the aspect illustrated in FIG. 2B, wherein the pumping radiation emanates from the same side of the structure as the desired emission, the photoluminescent materials must be chosen so as to permit sufficient optical transmission of the excitation radiation (excitation radiation that causes emission of the primary radiation) to initiate the pumping radiation. The photoluminescent materials of the energy conversion layer (12), preferentially comprise organic fluorescent dye molecules.

In another aspect of the energy conversion layer, the energy conversion layer may additionally contain materials to optically scatter the pumping radiation and/or emitted radiation. The scattering of the pumping radiation serves to increase the effective optical path length of the layer thereby increasing the amount of pumping radiation absorbed and converted. The scattering of the emitted radiation serves to alter the path of emitted rays that would otherwise be emitted from the edges of the energy conversion layer due to total internal reflection.

Figure 3:
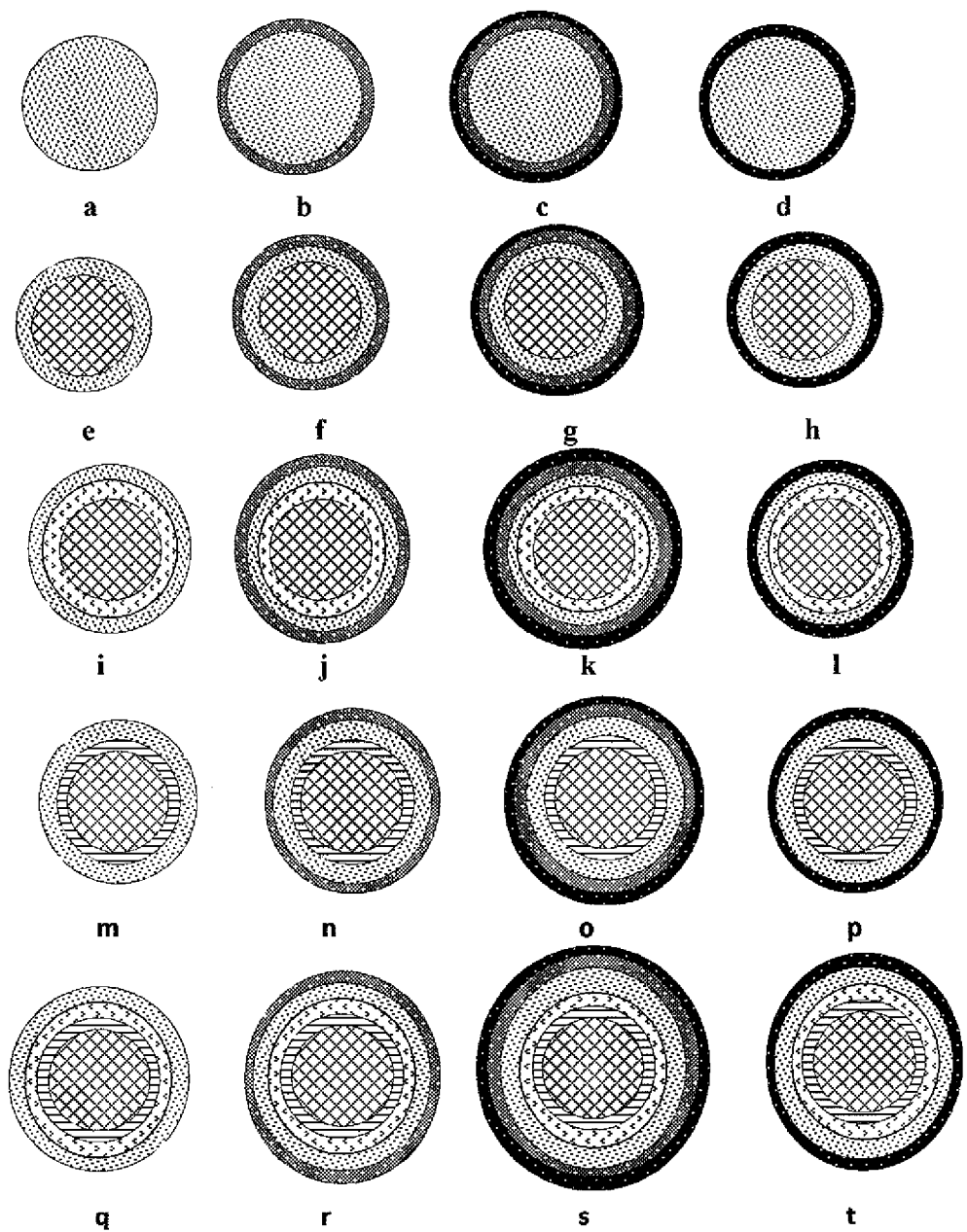
FIG. 3 is a schematic illustration of multi-layer particle configurations: (a) Energy conversion layer (ECL) without any outer layers; (b) ECL with Stability Enhancement Layer; (c) ECL with Stability Enhancement Layer and Protective Layer; (d) ECL with Protective Layer; (e) Core Layer with ECL layer; (f) Core Layer with ECL and Stability Enhancement Layer; (g) Core Layer with ECL, Stability Enhancement Layer, and Protective Layer; (h) Core Layer with ECL and Protective Layer; (i) Core Layer with Diffusion Layer and ECL; (j) Core Layer with Diffusion Layer, ECL and Stability Enhancement Layer; (k) Core Layer with Diffusion Layer, ECL, Stability Enhancement Layer and Protective Layer; (l) Core Layer with Diffusion Layer, ECL and Protective Layer.
Figure 3:
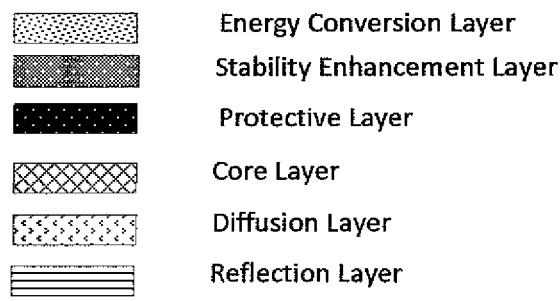

In another aspect of the formation of the energy conversion layer, one can prepare single or multilayered particles of the dye/polymer solid state solution (as shown in FIG. 3 and further disclosed below) and prepare an energy conversion layer by dispersing the particles in either the same or different polymer solution and subsequently rendering them as a layer on a suitable substrate. By preparing the dye/polymer solid state solution as a particle the choice of polymer useful to obtain a solid state solution can be separated from the choice of polymer and other materials needed to prepare an appropriate layer structure.

Stability Enhancement Layer: The energy conversion structures of these teachings, in addition to the energy conversion layer, also comprise one or more stability enhancing layers (6), as shown in FIGS. 2A & 2B, which protect said photoluminescent materials of the energy converting layer (2) or (12) from light-induced (photolytic) degradation as well as thermal degradation so as to provide sustained emissions. In one aspect of creating the energy conversion structure, the stability enhancement layer can be rendered as a discrete layer. While this is preferable, it should be recognized that some functionality of the stability enhancement layer can also be achieved within the energy conversion layer itself by suitable selection of the polymer matrix of the energy conversion layer. In certain applications it is advantageous to have the stability enhancement layer on both the top and bottom surfaces of the energy conversion layer.

In another aspect of creating the energy conversion structure, one or more energy conversion layers and one or more stability enhancement layers can be rendered as discrete multilayer particles. It should be recognized that such discrete particles may be used as is for some applications, or they may be subsequently incorporated into polymer formulations for the purpose of generating non-discrete (contiguous), planar or otherwise structures. For such a case, one can further create the final structure for use as a single layer film by dispersing the multilayer particles in a suitable polymer solution and forming a layer on a suitable substrate.

Reflection Layer: With continuing reference to FIG. 2A and FIG. 2B, the energy conversion structures of the present teachings may optionally comprise a reflection layer (4) for forward-directing the electromagnetic radiation emitted in a backward propagating direction. The reflection layer (4) allows for maximizing the collection and utilization of the radiation emitted by the energy converting layer (2). With reference to FIG. 2A, when the desired emission is intended to exit the structure from a second surface, different from the first surface from which the pumping radiation enters the energy conversion layer, the reflection layer may be a wavelength-selective reflector that is sufficiently transmissive of the pumping radiation and reflective of the radiation emitted by the energy conversion layer. For the case represented by FIG. 2B, since the pumping radiation source is either in the energy conversion layer, or a layer below, the reflection layer need be reflective of the primary and converted radiation.

A reflection layer may also be incorporated into particle structures such as have been described in the foregoing disclosure. In one aspect, one or more energy conversion layers and stability enhancement layers can be prepared on the surfaces of diffuse dielectric particles such as titanium dioxide. In another aspect, a wavelength-selective reflection layer can be prepared on the surface of a dielectric core, such as hollow glass spheres. One or more energy conversion layers and stability enhancement layers can subsequently be formed on the surfaces of such reflection layer cores.

Diffusion Layer: Referring to FIG. 2A, the energy conversion structures of the present teachings may optionally comprise a diffusion layer (5) to increase optical scattering. The diffusion layer (5) is optically coupled to the energy conversion layer, to increase the effective optical path length of the energy conversion layer, thereby increasing the amount of pumping radiation absorbed and converted by the energy conversion layer. In another aspect, the diffusion layer can be optically coupled to the energy conversion layer to provide scattering of the emitted radiation of the energy conversion layer, thereby reducing the amount of light that would be trapped within the energy conversion structure due to total internal reflection. In certain applications, it is advantageous for the diffusion layer to be used in conjunction with a reflection layer such that the backscattered light from the diffusion layer is redirected through the preferred surface.

Protective Layer: The energy conversion structure of the present teachings may also optionally comprise a top protective layer (8) which protects the film structure from physical and chemical damage upon environmental exposure. This layer may also include other additives, such as photo-stabilizers, anti-oxidants, hindered amine light stabilizers (HALS), singlet oxygen scavengers, etc.

Detailed Description of Layers

Energy Conversion Elements within Energy Conversion Layer:

The photoluminescent materials used in the energy conversion layer of the energy conversion structure of the present teachings are selected based on their absorption and emission properties, with preference given to materials with high quantum yields. Preferably, the energy conversion layer comprises organic fluorescent dyes. These dyes include, but are not limited to, rylenes, xanthenes, porphyrins, phthalocyanines, and others with high quantum yield properties. Rylene dyes are particularly useful. Rylene dyes include, but are not limited to, perylene ester and diimide materials, such as 3-cyanoperylene-9,10-dicarboxylic acid 2',6'-diiosopropylanilide, 3,4,9,10-perylene tetracarboxylic acid bis(2,6-diisopropyl) anilide and 1,6,7,12-tetraphenoxy-N,N'-di(2,6-diisopropylphenyl)-3,4:9,10-perylenediimide for example. Xanthene dyes include, but are not limited to, Rhodamine B, Eosin Y, and fluorescein. Porphyrins include, for example, 5,10,15,20-tetraphenyl-21H,23H-tetraphenylporphine and 2,3,7,8,12,13,17,18-octaethyl-21H,23H-porphine.

Energy Conversion Layer—Dye Polymer Solid State Solution:

The matrix into which the dyes are dispersed can comprise of polymers or glasses. Polymers are particularly useful due to the greater range of available materials from which to sub-select so as to form a homogeneous mixture of the energy conversion element and the polymer. Acceptable polymers include acrylates, polyurethanes, polycarbonates, polyvinyl chlorides, silicone resins, and other common polymers. Materials with glass transition temperatures above the normal operating temperature of the material are particularly useful. The polymer matrix must be capable of preventing aggregation of the dye, that is creating a homogeneous mixture of the dye and the polymer, or a solid state solution of the dye and polymer. Dye aggregation is one of the possible causes of loss of fluorescence efficiency and in certain cases can also contribute to photolytic degradation. If the dye molecules are allowed to form aggregates and microcrystalline forms, instead of a solid state solution, the dye molecules excited by electromagnetic radiation can undergo static self-quenching, effectively lowering the yield of dye fluorescence, and therefore lowering the efficiency of energy conversion. In some dyes, high dye concentrations can lead to enhanced photodegradation, through efficient energy migration to chemically active traps or through self-sensitized photo-oxidation stimulated by triplet states accessed primarily from excimers.

When dye aggregation leads to the creation of crystals in a condensed medium, the effective molar extinction of the dye declines, requiring still higher concentrations to maintain an acceptable optical density. In addition, the characteristic size of microcrystalline forms can approach wavelengths of visible electromagnetic radiation, leading to light scattering, effectively increasing the path length that the light must travel before escaping from the film structure. In instances where dye concentrations are of high optical density, the light scattering can lead to increased reabsorption of fluorescence, resulting in a reduction in the energy conversion efficiency.

It should be noted that it is very difficult, if not impossible, to directly measure/determine if the chosen dye is in solid state solution in the polymer. The determination of this is inferential and results from examining absorption and emission spectra. While molecular dimers do not usually show a change in the electronic absorbance spectrum, the effects of excimer formation can be observed as significant broadening of the emission spectrum, a shift to longer wavelengths, and a reduction in total emission in the fluorescence emission spectrum. Larger microcrystalline aggregates manifest changes in the radiation absorption spectrum. For example, J-aggregates show a red shift in the absorption spectrum (to higher wavelength), while H-aggregates show a shift to the blue.

In the construction of an effective energy conversion layer capable of sustained emissions, as mentioned above, it is important to achieve a homogeneous mixture of dye and polymer in the solid state, that is without the formation of aggregates. One of the ways that such a homogeneous mixture may be prepared is by dissolving the polymer and the dye in a suitable solvent. The selection of the matrix polymer, solvent, and other dispersants and additives, has to be such that the dye remains dissolved throughout the coating and drying process. The state of the dye in the polymer in the solid state should be essentially free of aggregates, that is the dye must be in a solid state solution in the polymer after drying. The dye may also be incorporated into the polymer without the use of solvents by heating a mixture of the polymer and dye to the melt state with physical mixing. Care must be taken during such a process to assure that the dye is completely dissolved, while limiting the mixing time and temperature to minimize polymer and dye thermal degradation. It should be noted that if the dye and polymer are not adequately compatible, a homogeneous mixture may not result in spite of taking the precautions described above. The polymer should also be selected for its thermal stability at the operating temperatures experienced by the multilayer film structure. Insofar as polymer chain motion affects the rate of polymer decomposition and depolymerization, materials with glass transition temperatures above the normal operating temperature of the film are preferred for many polymer classes. However, there are exceptions to this general principle. For example, silicone rubbers are known to possess exceptional thermal stability in spite of having glass transition temperatures well below normal room temperatures.

Before one can determine whether a specific dye is in a solid state solution in a specific chosen polymer, it is important to first establish a reference absorption and emission spectra for the specific energy conversion material. This can be done by generating absorption and emission spectra in a variety of solvents, and by analyzing the resulting spectra together with any published spectra, so as to select a suitable reference solvent, wherein the energy conversion photoluminescent material is soluble in the solvent at the required concentration. The reference spectra, however, is generally generated at very dilute concentrations. The spectra thus generated can then serve as the reference absorption and emission standard. When it is necessary to select other solvents for solubility reasons, comparisons can be made with reference spectra at the desired concentration, as well as by comparing spectra of a very dilute solution of the same material, to determine if the absorption of the energy conversion photoluminescent material is shifted to much longer wavelengths, which is diagnostic of molecular aggregates, and the emission spectrum is neither quenched nor broadened and shifted to longer wavelengths, which is diagnostic of excimer formation. For materials that have been well researched, there will be suitable reference spectra that can be used as a basis for recognizing significant spectral shifts. For newer materials, one has to rely on spectra generated at very dilute concentrations together with any absorption and emission as a reference basis, and significant shifts could be interpreted as indicative of aggregate formation. The solubility can be checked with a light scattering apparatus, and the absorption and emission by a fluorescence spectrophotometer. The selected solvent should also be capable of dissolving the selected polymer. To determine if the selected dye will be in a solid state solution in the polymer, different polymers can be similarly screened, together with the energy conversion photoluminescent material, by first observing the absorption and emission in a formulation comprising the energy conversion photoluminescent material, the polymer, and the solvent, and second, by observing the absorption and emission in a coating prepared from the formulation by removing the solvent and analyzing comparisons with the reference spectra for evidence of aggregate and/or excimer formation.

Energy Conversion Layer—Other Additives:

Additional components may be added to the formulation to facilitate the dissolution and coating of the energy conversion photoluminescent material and the polymer, such as dispersants, wetting agents, defoamers, rheology modifiers, and leveling agents. Dispersants, wetting agents, defoamers, and leveling agents may each be oligomeric, polymeric, or copolymeric materials or blends containing surface-active (surfactant) characteristic blocks, such as, for example, polyethers, polyols, or polyacids. Examples of dispersants include acrylic acid-acrylamide polymers, or salts of amine functional compound and acid, hydroxyfunctional carboxylic acid esters with pigment affinity groups, and combinations thereof, for example DISPERBYK®-180, DISPERBYK®-181, DISPERBYK®-108, all from BYK-Chemie, and TEGO® Dispers 710 from Degussa GmbH. Wetting agents are surfactant materials, and may be selected from among polyether siloxane copolymers, for example, TEGO® Wet 270, non-ionic organic surfactants, for example TEGO® Wet 500, and combinations thereof. Suitable rheology modifiers include polymeric urea urethanes and modified ureas, for example, BYK® 410 and BYK® 411 from BYK-Chemie®, and fumed silicas, such as CAB-O-SIL® M-5 and CAB-O-

SIL® EH-5. Deaerators and defoamers may be organic modified polysiloxanes, for example, TEGO® Airex 900. Leveling agents may include polyacrylates, polysiloxanes, and polyether siloxanes. Quenchers of singlet molecular oxygen can also be added, such as 2,2,6,6-tetramethyl-4-piperidone and 1,4-diazabicyclo[2.2.2]octane Each such material must be tested to assure that it does not cause aggregation of the energy conversion photoluminescent material, and that the material does not react, either thermally or photochemically, with the energy conversion photoluminescent materials.

According to the present teachings, one preferred photoluminescent composition, includes from about 25%-45% of binder resin, about 50%-70% of liquid carrier, 0%-2% dispersing agent, 0%-2% rheology modifying agent, 0%-2% photostabilizer, 0%-2% deaerating agent, 0%-2% wetting agent, and 0.01%-0.2% photoluminescent fluorescent material.

Energy Conversion Layer—Preparation Methods:

Once proper materials and concentrations have been identified, a variety of methods can be used to prepare an effective energy conversion layer. Such methods include coating a layer that is generally planar on a support, the layer being prepared from a formulation in a liquid carrier medium. For example, such coatings can be deposited by painting, screen printing, spraying, slot coating, dip coating, roller coating and bar coating. In addition, an effective energy conversion layer may be prepared by methods that do not use a liquid carrier medium. For example, a solid solution of an energy conversion photoluminescent material in a polymer can be converted to an energy conversion layer by extrusion, injection molding, compression molding, calendaring, and thermoforming. It should be noted that some of these methods can be particularly useful in producing non-planar layers. The energy conversion layer can also be prepared by forming particles by any one of a number of methods of preparing such particles. When the energy conversion element is prepared as a combination of several different energy conversion layers, the individual layers can be sequentially coated, or the individual layers can be separately prepared and later laminated or embossed together to form an integral layer. Alternatively, an integrated energy conversion layer can be prepared by coextrusion of the individual layers. In all cases in which the energy conversion layer is prepared by combining several different energy conversion layers, the integrated energy conversion layer will only function properly if the separate layers are properly ordered. That is, photoluminescent materials that produce a higher average wavelength should generally be placed closer to the outermost surface of the structure.

The elements of the structure of the present teachings may be combined into an integrated structure by a number of methods well known in the art. For example, the energy conversion layer may be coated onto the reflective layer, or it may be separately prepared and subsequently laminated to the reflective layer. An integrated structure may be constructed by sequential coating or printing of each layer, or by sequential lamination or embossing. Alternatively, several layers may be combined by sequential coating, lamination or embossing to form a substructure, and the required substructure then laminated or embossed together to form the integrated multilayer structure. As had been mentioned above, the integrated structure can also be created by forming multilayer particles comprising energy conversion layer, or, comprising energy conversion layer and stability enhancement layer and subsequently rendering them as a planar layer.

Stability Enhancement Layer—Details:

Although photolysis and thermolysis phenomena have been studied, such studies at best only serve as guidelines for identifying the variables that may affect the performance of a photoluminescent material in a given situation. Usually, a combination of factors is responsible for causing photolytic or thermal degradation and not all variables are equally important. Hence, a great deal of systematic experimentation is required to determine a suitable composition and structure for stabilizing the photoluminescent material against photolytic and thermal degradation. A first objective in determining a suitable structure is to screen a variety of polymer solvent systems, wherein both the photoluminescent material and the polymer are soluble in the solvent, preparing a film from such a formulation, and studying its photolytic and thermal degradation. To qualify a polymer for its thermal properties, the polymer should be thermally stable. Generally, it is advantageous to select a polymer which glass transition temperature is higher than the expected operating temperature. It would be desirable to select a polymer with a glass transition temperature that is 10° C. to 15° C. higher than the operating temperature. In studying the thermal stability of the polymer, in many cases, color change upon prolonged periods of exposure to heat is evidence of thermal degradation. After thermal qualification, the polymer is tested for photolytic stability. Following this qualification, the dye/polymer system is similarly tested for thermal and photochemical stability. In most cases, loss of optical density of the dye is the primary criterion of system stability. In addition, changes in fluorescence should also be monitored as an indication of degradation.

By way of example, the following experimentation was undertaken for a case wherein the multilayer film structure was to operate outdoors in an environment wherein the operating temperature of the film conversion element was anticipated to be 50° C. or lower. The polymer and the photoluminescent material solvent system were screened by testing in an environmental test chamber for the purposes of selecting the appropriate polymer/solvent system that was photolytically and thermally stable. For purposes of illustration, Table 1 demonstrates the effect that choice of polymer and solvent can have on dye stability, using acrylic polymers (Neocryl®materials) and polyurethanes (Solucote® materials) as examples. The dye/polymer combinations were screened without the use of any additional stabilization structures using test conditions presented in Table 1. This is because for screening it was important to select test conditions that would allow discrimination between species quickly. As is apparent from Table 1, different polymer/solvent systems can have a remarkable effect on photolytic and thermal degradation. The specific dye used in this example exhibits low photolytic stability in urethane materials as compared to acrylics. Materials from the same polymer class can also manifest different photolytic stability characteristics. This is because the different manufacturing processes utilized by various manufacturers can result in varying amounts of residual monomers, residual level and type of catalysts, etc., creating variables affecting polymer stability characteristics and, in turn, impacting the stability of the energy conversion materials.

Once a suitable polymer/solvent system for the energy conversion material under consideration was determined, the impact of various additives, such as UV absorbers, hindered amine light stabilizers (HALS), to reduce photolytic and thermal degradation was explored. An example of this line of experimentation is presented in Table 2. For this dye and polymer combination, it was found that UV absorbers offered significant photostability improvement, while free radical quenchers and hindered amine stabilizers had little effect. Having selected a baseline system comprised of polymer, solvent, additives (UV absorbers, antioxidants, etc.), it was concluded that it would be desirable to look for additional factors that could retard photolytic degradation.

oxygen. For example, in "Photodegradation of Polymer-Dispersed Perylene Di-imide Dyes," by Nobuaki Tanaka, et al., Applied Optics, Vol 45 (2006), pp. 3846-51, it is reported that

TABLE 1

| Dye | Binder[3] | Solvent | Photolysis[1,2] Time (hours) | | | |
|---|---|---|---|---|---|---|
| | | | 6 | 24 | 54 | 72 |
| 3-cyanoperylene-9,10-dicarboxylic acid 2',6'-diisopropylanilide | Neocryl ® B805 acrylic | Toluene | −3.0% | −10.2% | −19.3% | −25.5% |
| | | Toluene/dioxolane | −5.7% | −14.7% | −17.1% | −24.8% |
| | | Dimethyl Carbonate | −1.1% | −5.6% | −10.8% | −15.8% |
| | | Ethyl Acetate | −2.6% | −9.2% | −14.9% | −21.3% |
| | | Acetone | −4.7% | −17.0% | −33.8% | −38.1% |
| | Neocryl ® B805 acrylic/CAB | Toluene/MPA | −0.9% | −2.6% | −5.2% | −7.7% |
| | Neocryl ® B818 acrylic | none | −3.7% | −24.2% | −49.6% | −62.0% |
| | Solucote ® 148-102 | DMF | −3.0% | −21.8% | −58.1% | −73.4% |
| | Solucote ® 141-301 | DMF | −12.7% | −50.7% | −79.8% | −88.7% |
| | Solucote ® 12875 | DMF | −27.1% | −62.7% | −71.0% | * |

[1]Photolysis performed with a water-cooled, high pressure xenon arc lamp filtered to simulate a daylight spectrum to deliver 0.76 W/m[2] at 340 nm.
[2]Data are presented as a percentage loss in absorbance (optical density).
[3]Neocryl ® B805, Neocryl ® B818, and all Solucote ® materials were obtained from DSM Neoresins; cellulose acetate butyrate (CAB) was obtained from Eastman Organic Chemicals.
[4]Empty cells indicate that a test was stopped due to a significant loss in optical density.

TABLE 2

| Dye | Binder[3] | Stabilizer | Photolysis[1,2] Time (hours) | | | |
|---|---|---|---|---|---|---|
| | | | 6 | 24 | 54 | 72 |
| 3,4,9,10-perylene tetracarboxylic acid bis(2,6-diisopropyl) anilide | Neocryl ® B818 acrylic | none | −19.8% | −34.9% | −47.9% | −60.2% |
| | | 2% Tinuvin ® 123 | −13.1% | −25.0% | −40.5% | −51.1% |
| | | 2% Irganox 1035 | −16.8% | −46.2% | −66.6% | −75.7% |
| | | 2% Tinuvin ® 405 | −3.30% | −5.96% | −12.94% | −21.95% |
| | | 2% Cysorb UV-531 | −8.5% | −14.5% | −19.3% | −45.3% |
| | | 2% Chimmasorb 944 | −13.0% | −37.9% | −60.7% | −85.7% |
| | Neocryl ® B805acrylic Tol/EtAc w/EGME | none | −3.6% | −13.5% | −28.8% | −23.9% |
| | | 2% Tinuvin ® 405 | −1.7% | −4.0% | −6.6% | −9.4% |
| | Lucite 47G | none | −3.1% | −6.1% | −15.5% | −17.6% |
| | | 2% Tinuvin ® 405 | −1.5% | −3.0% | −6.0% | −8.9% |
| | Solucote ® 148-102 | none | −40.5% | −87.3% | −94.0% | −94.9% |
| | | 2% Tinuvin ® 405 | −28.0% | −76.7% | −91.2% | −92.9% |
| | | 2% Tinuvin ® 123 | −38.5% | −83.8% | −93.4% | −94.6% |
| | | 2% Irganox ® 1035 | −28.6% | −80.1% | −93.1% | −93.7% |
| | | 2% Tinuvin ® 405 | −17.4% | −73.9% | −90.9% | −92.8% |

[1]Photolysis performed with a water-cooled, high pressure xenon arc lamp filtered to simulate a daylight spectrum to deliver 0.76 W/m[2] at 340 nm.
[2]Data are presented as percentage loss in absorbance (optical density).
[3]Tinuvin ® 123, Tinuvin ® 405, Irganox ® 1035. and Chimmasorb ® 944 were obtained from Ciba; Cyasorb UV-531 was obtained from CYTEC Industries.

Need for Stability Enhancement Layer:

Many organic dyes suffer from photolytic decomposition either as solutions in a solvent or as a homogeneous mixture with a polymer when irradiated in the presence of air. In some cases, the decomposition can be traced to the decomposition of a surrounding polymeric matrix, which can generate free radical intermediates that attack the dye molecules. Some polymers contain UV chromophores that, after excitation, can sensitize the formation of singlet oxygen. In some cases, the dye can sensitize its own decomposition through the generation of singlet oxygen. While fluorescent dyes generate very few triplet species in their photophysics, the small amount that occurs can effectively transfer energy to available molecular oxygen to generate reactive singlet oxygen. This species can then attack nearby dye molecules to generate non-fluorescent products. In addition, the choice of polymer matrix can affect the lifetime of singlet oxygen. Citations have been made about the beneficial effects of the presence of dyes can also degrade by photoreduction mechanisms, in which case available oxygen can both compete for the reductant, as well as reoxidize the reduced dye. The authors identify that the presence of oxygen in the vicinity of the dye can reduce the rate of photolytic degradation. In other words, preventing the transmission of oxygen can lead to more rapid dye degradation. Surprisingly, the opposite is found to be true. Specifically, it has been determined that certain polymer coatings when made from materials that are known to significantly retard the diffusion of oxygen have a dramatic impact on improving photolytic stability. Thus, to extend the stability of the energy conversion materials, a stability enhancement layer is incorporated within the multilayer structure of the present teachings. Useful materials that can be used in the stability enhancement layer of the teachings include, but are not limited to, a number of materials commonly used today to inhibit the transmission of air, especially in applications such as food packaging. Such useful materials include, but are not limited to, polyvinyl alcohol, ethylene vinyl alcohol copolymers, polyvinyl chloride, polyvinylidene chloride copolymers (saran), nylons, acrylonitriles, polyethylene terephthalate polyester, polyethylene naphthalate, polytrimethyl terephthalate, liquid crystal polymers, transparent inorganic oxide coatings, nanocomposites, oxygen scavengers, aromatic polyketones and any combinations or blends thereof.

It has been mentioned above that in certain situations it is advantageous to have the stability enhancement layer on both the front and bottom surfaces of the multilayer energy conversion structure. One of the preferred ways of achieving that is to create a stability enhancement layer that inhibits the transmission of oxygen on one side of the energy conversion layer, for example on the side of the converted emission emitting surface, and for the other side the dielectric reflection layer prepared from metal oxide coatings. The low diffusion of oxygen through the metal oxide layers serves as an effective second stability enhancement layer in this case. It should also be noted that for certain applications, a suitably thick polyester substrate onto which are rendered the energy conversion layer and the stability enhancement layer can also provide some functionality in retarding the diffusion of oxygen on from the opposite side.

Singlet molecular oxygen is presumed to be an important reactive species in the photolytic degradation of dyes. While reducing the concentration of oxygen is an effective deterrent to the creation of singlet oxygen, this species can also be quenched by a number of additives thereby preventing it from reacting with the dye. Such quenchers should be placed in the layer in which the singlet oxygen is most readily formed, that is in the energy conversion layer. Examples of singlet oxygen quenchers include, but are not limited to, 2,2,6,6-tetramethyl-4-piperidone, 1,4-diazabicyclo[2.2.2]octane, and diphenylsulfide.

Reflection Layer—Details:

For the energy conversion structure of the present teachings to function as an efficient primary radiation conversion device, the desired emission for the device should take place on the hemisphere on the forward-propagating side of the principal emitter. Therefore, it is important to redirect the backward propagating light. Although use of photoluminescent materials, such as fluorescent dyes, that are in solid state solution in the polymer matrix minimizes back scatter by eliminating small aggregates, backward propagating emission remains, since dyes are isotropic Lambertian emitters. Referring to FIG. 2A and FIG. 2B, reflection layer (4) redirects all wavelengths of the radiation into the forward-propagating hemisphere. Reflection layer (4) can be advantageously used behind the energy conversion layer (2) or (12), wherein the primary emitter is also a Lambertian emitter. Reflection layer (4) can also be designed to allow transmission of the pumping radiation when such radiation occurs in the rearward-propagating hemisphere, as in FIG. 2A.

The preferred reflection layer is dependent on the design of the application. For example, when primary radiation is provided by a source such as an LED from behind the film structure, such as in FIG. 2A, a wavelength-selective specular reflection layer is preferred so as not to disrupt the transmission of light to the energy conversion layer. Such a selective reflection layer can be made by alternately layering non-metallic materials with high and low dielectric constants with layer thicknesses of approximately 1;4 the wavelength of the light to be reflected. The characteristics of the reflection layer are a function of the refractive index difference between the materials used in the low dielectric layers and those in the high dielectric layers, as well as the number of layers in the reflection layer structure. Typical refractive index differences fall in the range 0.05-1.0. Typical low dielectric materials have refractive indices at visible wavelengths in the range 1.35-1.50 and include materials such as, but not limited to, $MgF_2$, $CaF_2$, and fused silica. Typical high dielectric materials have refractive indices that range from 1.45-2.5 and include, but are not limited to, aluminum oxide, zirconium oxide, and titanium oxide. The high and low dielectric materials may also comprise optical polymers of suitable refractive index differences. Such dielectric stacks can be designed to pass a selective band of wavelengths, or they may be created as high- or low-pass filters.

On the other hand, when the primary radiation originates within the multilayer structure such that the primary emission generating materials are within the energy conversion layer, or in a layer below such as in FIG. 2B, or wherein the primary emission originates from the front or viewing side of the multilayer structure a diffuse reflection layer that is reflective of both the primary and secondary emissions is preferred. Such a diffuse reflection layer can be made as a film or coating or layer from materials that scatter but do not absorb the wavelengths of interest. For example, white poly(ethylene terephthalate) can be prepared by extruding the polymer incorporated with titanium dioxide. Such materials are sold by, for example, Dupont Corporation under the trade name Melinex®. Alternatively, a diffuse reflection layer may be prepared by fluid coating a dispersion of the material in a polymeric binder onto a reflective substrate. For example, reflective substrates include poly(ethylene terephthalate) onto which has been deposited a thin aluminum coating. Suitable materials for diffuse reflection layers include titanium oxide, silicon dioxide, etc. The polymer is usually chosen based on compatibility with other layers to which it will be laminated, so as to provide good adhesion and optical coupling. Acceptable polymers include, but are not limited to, acrylates, polyurethanes, polycarbonates, polyvinyl chlorides, silicone resins, and other common polymers. In particular, it is important that the polymer materials do not absorb the pumping or emitted radiation. In addition, additives such as, but not limited to, dispersants, wetting agents, defoamers and leveling agents, may be added to the formulations used for coating such materials to aid in the dispersion of the scattering materials and the coating of the formulation. Such dispersants, wetting agents, defoamers, and leveling agents may each be oligomeric, polymeric, or copolymeric materials or blends containing surface-active (surfactant) characteristic blocks, such as, for example, polyethers, polyols, or polyacids.

Diffusion Layer—Details:

In some aspects of the present teachings it can be desirable to provide optical scattering of radiation. Optical scattering is provided by materials separated into discrete domains that possess significantly different optical indices of refraction, in most cases due to the materials having different densities. In addition, the sizes of the domains have a significant effect on the efficiency of scattering, with larger domains providing more scattering. Scattering layers can be produced in a variety of polymers, including acrylics, polyesters, polyurethanes, and the like. The polymer for the diffusion layer is usually chosen based on compatibility with other layers to which it will be laminated, so as to provide good adhesion and optical coupling. Materials that can commonly be incorporated into polymer layers to provide scattering include titanium dioxide, mica, and glass microspheres. In addition, small domains of incompatible polymers may be formulated to produce diffuse, scattering layers. In certain applications, it is advantageous for the diffusion layer to be used in conjunction with a reflection layer, such that the backscattered light in the diffusion layer is redirected through the preferred surface.

The diffusion layer can be prepared by extrusion of a polymer layer that includes the scattering materials. Alternatively, the diffusion layer can be prepared by coating a formulation of the scattering materials with a polymer binder in a suitable solvent onto a clear substrate. Acceptable substrate materials include, but are not limited to, polyesters, polycarbonates, acrylics, polyurethanes, and the like. The polymer is generally chosen based on compatibility with other layers to which it will be laminated, so as to provide good adhesion and optical coupling. Acceptable polymers include, but are not limited to, acrylates, polyurethanes, polycarbonates, polyvinyl chlorides, silicone resins, and other common polymers. In particular, it is important that the polymer materials do not absorb the pumping or emitted radiation. In addition, additives such as, but not limited to, dispersants, wetting agents, defoamers and leveling agents, may be added to the formulations used for coating such materials to aid in the dispersion of the scattering materials and the coating of the formulation. Such dispersants, wetting agents, defoamers, and leveling agents may each be oligomeric, polymeric, or copolymeric materials or blends containing surface-active (surfactant) characteristic blocks, such as, for example, polyethers, polyols, or polyacids.

Protective Layer—Details:

The film structure of the present teachings also comprises a top protective layer which protects the film structure from physical and chemical damage upon environmental exposure. Since the material properties of common air barrier materials render them sensitive to normal physical and chemical wear and degradation, the robustness of the structure is improved by the addition of a top protective layer to provide these properties. For example, when polyvinyl alcohol or other water compatible polymer materials are incorporated within the stability enhancement layer, it is preferred to position a protective layer over the stability enhancement layer to help shield the stability enhancement layer from atmospheric humidity. Useful protective materials for the film structure include, but are not limited to, poly(methylmethacrylate), polycarbonate, and polyesters. Since many polymers can degrade upon exposure to ultraviolet (UV) radiation, it is preferred that this top layer also contains absorbers of UV light that also protects the polymer and dye layers below it. Acceptable UV absorbers include, but are not limited to, hydroxybenzophenones, such as Chimmasorb® 81 from Ciba, hydroxyphenyl benzotriazoles, such as Tinuvin® 326 from Ciba, and hydroxyphenyl triazines, such as Tinuvin® 405 from Ciba. The top surface of the top protective layer may be modified to optimize light extraction from the structure. Such modifications may include, but are not limited to, antireflection layers or brightness enhancement structures, such as those and similar to those described in U.S. Pat. Nos. 4,542,449, 4,791,540, 4,799,131, 4,883,341, 4,984,144, all which are incorporated by reference herein in their entirety. In addition, the top layer may contain additional materials to enhance stability referred to earlier as photostabilizers such as antioxidants, HALS, singlet oxygen scavengers, etc.

Methods of Providing Primary Emission:

It should be recognized that the structure of the present teachings is not limiting with regard to the method of introducing the primary electromagnetic radiation. For example, as shown in FIG. 4, the primary electromagnetic radiation may be supplied from an illumination source (16) through a waveguide (18), with the energy conversion layer (20) positioned at a region designed to extract light from the waveguide. In one aspect, the energy conversion layer may be optically coupled to the waveguide, in which case the light extraction mechanism may occur either within the energy converting layer itself or within a separate optical structure incorporated with the waveguide. Where the energy conversion layer is optically coupled to the waveguide, it is preferred to have a stability enhancement layer on the light exiting side of the energy conversion layer. In another aspect, the energy conversion layer may be positioned without being optically coupled to the waveguide. In this aspect, the light extraction mechanism occurs within a separate optical structure of the waveguide, and preferably, the stability enhancement layer is on both the top and bottom surfaces of the energy conversion layer. Embodiments wherein the stability enhancement layer is absent are also within the scope of these teachings. Hence in certain situations, the total flux of photons over the life of the energy conversion layer may be low, thereby resulting in minimal, if any, photolytic degradation of the energy conversion layer and thus, a stability enhancement layer is not required.

If the waveguide has multiple regions from which light can be extracted, different energy conversion structures with different conversion properties can be positioned at each such region to provide, for example, multiple colors from a single source. Multiple energy conversion structures can be combined with multiple sources to provide a multicolor display, as illustrated in FIG. 5. In addition, the energy conversion structure is not required to have a planar geometry. For example, a cylindrical structure (22) may be used with a cylindrical source (24), such as a fluorescent or chemiluminescent tube, as illustrated in FIG. 6. It should be noted, as stated above, that the above examples, applications and embodiments are not limitations of these teachings and other embodiments in which the primary electromagnetic radiation source is in varying degrees of proximity to the energy conversion structures, including embodiments in which the energy conversion structures integral to the electromagnetic radiation source, are within the scope of these teachings.

In these instances, as described herein and above, the one or more energy conversion layers when combined with an illumination source and a waveguide are used as an illumination delivery system for generating sustained secondary emission. In this aspect, the illumination source provides a primary electromagnetic radiation and can be any source of electromagnetic radiation, such as, but not limited to, a chemiluminescent source, a laser, an electroluminescent source, one or more photoluminescent materials, or a solid state device, e.g. an organic light emitting diode. The waveguide receives and propagates the primary electromagnetic radiation emitted from the illumination source and further transmits at least a portion of such radiation to the one or more energy conversion layers. The waveguide has a top surface and a bottom surface and comprises a substantially transparent material, such as, but not limited to, plastic or glass, with minimal, if any, optical absorption or elastic scattering of the primary electromagnetic radiation. More specifically, acceptable substantially transparent materials include, but are not limited to, borosilicate or pyrex glasses, as well as plastic materials, such as bisphenol A polycarbonate, poly (methylmethacrylate), other acrylic copolymers, polyurethanes, polystyrenes, polyesters, other glassy polymers, etc. In addition, although it may be preferred that the waveguide be substantially planar in geometry, instances where the waveguide is not substantially planar are also within the scope of these teachings. Thus, the geometric properties of the waveguide can be selected to provide the most suitable illumination delivery system for the specific application for which the system is used.

It should be noted that, unlike the waveguide of the present teachings, most planar waveguides are designed to propagate single optical modes, which require such waveguides to comprise layers, generally referred to as cladding layers, that surround the substantially transparent material in order to constrain the number of optical modes disseminated within the waveguide, e.g. U.S. Pat. Nos. 7,639,916 and 8,128,272 and U.S. patent application Ser. Nos. 12/421,554 and 13/289,442. However, given that the waveguide of the present teachings is designed to propagate multiple optical modes, there is no need for, and thus no inclusion of, cladding layers within the waveguide of the present teachings.

Generally, the primary electromagnetic radiation emitted from the illumination source is directed into one or more edges of the waveguide by means of optical coupling of the illumination source with the waveguide or by other optical methods to inject electromagnetic radiation. Alternatively, the illumination source can be separated from the waveguide, and optical means, such as lenses and prisms, can be used to direct the primary electromagnetic radiation into one or more edges of the waveguide. Furthermore, the waveguide can be designed to incorporate such optical elements to facilitate the injection of the primary electromagnetic radiation into one or more edges of the waveguide. In another aspect, the primary electromagnetic radiation can originate within the waveguide as a consequence of the illumination source being embedded within the waveguide. Given that the waveguide material of the present teachings has a refractive index that is significantly greater than that of air, preferably at least equal to about 1.3, internal reflection causes the primary electromagnetic radiation to be substantially constrained within the top and bottom surfaces of the waveguide until such radiation encounters a means by which its propagation vector is changed to become substantially normal to a surface of the waveguide. Internal reflection occurs when a ray of light passing through a medium reaches a boundary at which a medium of lower refractive index is encountered. In accordance with Snell's Law, the light ray will be, refracted, away from the normal to the interface. As the angle of incidence increases, a point will be reached where the ray is refracted to an angle of 90°, i.e. the light will remain in the original medium. This angle is defined as the critical angle. Rays incident to the interface at angles greater than or equal to the critical angle will be totally internally reflected causing the light to travel generally in a direction parallel to the interface. Hence, when the propagation vector is changed to become substantially normal to a surface of the waveguide, the primary electromagnetic radiation will exit the waveguide at such region. In this way, the one or more regions of the waveguide in which the primary electromagnetic radiation can exit may be displaced at a significant distance from that of the illumination source.

A number of methods may be used to extract the primary electromagnetic radiation from the waveguide such that the radiation can transmit through at least a portion of the top surface, the bottom surface, or both, of the waveguide in desired areas. In some instances, such desired areas may take the form of a predetermined shape. In a preferred method, at least a portion of the top surface, the bottom surface, or both, of the waveguide is roughened in one or more regions where it is desired to have the primary electromagnetic radiation exit. In one instance, roughening can be accomplished by surface deformation, such as etching. In another instance, roughening can be accomplished by the use of discrete prismatic structures that can be embossed or molded within the waveguide. In yet another instance, roughening can include rendering a thin layer of coating material, having substantially the same refractive index as the waveguide and one or more light scattering materials substantially dispersed therein, onto desired areas of the waveguide. Suitable coating materials include, but are not limited to, polyacrylates, polycarbonates, polyurethanes, and other polymers. Acceptable light scattering materials include, but are not limited to, non-absorbing materials with a substantially different refractive index than the coating material, such as titanium dioxide pigment, mica particles, or hollow glass spheres. Although other methods of extraction may be utilized within the present teachings, it should be noted that the use of a diffraction grading which results in spectral dispersion, is not a preferred method to extract primary electromagnetic radiation from the waveguide of the present teachings.

The one or more energy conversion layers, as previously described, absorb at least a portion of the primary electromagnetic radiation transmitted by the waveguide and convert the radiation into another electromagnetic radiation having a different spectrum, generally characterized by a higher average wavelength, i.e. a longer output wavelength. It is this longer output wavelength, along with any remaining primary electromagnetic radiation, that produces the observed spectrum of the illumination delivery system. The one or more energy conversion layers comprise a polymer and one or more fluorescent materials having an absorption spectrum that at least partially overlaps with the primary electromagnetic radiation. The luminous intensity of the one or more energy conversion layers are maximized by having a substantially uniform dissolution and coating of the one or more fluorescent materials and the polymer. To accomplish such dissolution and coating, in addition, one or more additives, such as, but not limited to, wetting agents, liquid carrier mediums, dispersant agents, deaerating agents, rheology modifiers or photostabilizers, may be incorporated into the one or more energy conversion layers, as previously described. For optimum conversion efficiency of the primary electromagnetic radiation, it is generally preferred that the one or more energy conversion layers have an optical transmission of at least equal to about 95 percent.

In general, to maximize the conversion efficiency of the one or more energy conversion layers, light scattering materials should be absent from the one or more energy conversion layers. However, in certain situations it may be advantageous to include such materials. Thus, in some instances, the one or more energy conversion layers may also comprise one or more light scattering materials that disperse at least a portion of the primary electromagnetic radiation, the longer output wavelength, or both. In doing such, the one or more light scattering materials increase the effective path length of the primary electromagnetic radiation and/or longer output wavelength within the one or more energy conversion layers, as well as provide homogenization of the radiation and redirect radiation that would otherwise become trapped within the one or more energy conversion layers by way of internal reflection.

The illumination delivery system may further comprise a reflection layer, as previously described, that redirects at least a portion of the primary electromagnetic radiation and/or the longer output wavelength, for example in the direction where it may be perceived. In some instances, the reflection layer may be optically coupled to a surface of the waveguide, whereas in other instances the reflection layer may be optically decoupled. In one instance, the reflection layer may be rendered between the one or more energy conversion layers and the waveguide so as to forward direct at least a portion of the longer output wavelength that would otherwise be emitted in a backward propagating direction. Furthermore, in such instances, the reflection layer is also substantially transmissive of the primary electromagnetic radiation so as to allow the waveguide to provide such radiation to that of the one or more energy conversion layers. In another aspect, the reflection layer may be disposed on one surface of the waveguide, e.g. the bottom surface, and the one or more energy conversion layers being disposed onto an opposing surface of the waveguide, e.g. the top surface, such that at least a portion of the primary electromagnetic radiation and/or the longer output wavelength is forwardly propagated. In some instances, the reflection layer may comprise a plurality of alternate layers of non-metallic materials having high and low dielectric constants. In other instances, the reflection layer may be a lenticular or a microprismatic element.

The illumination delivery system may further comprise a diffusion layer, as described previously, that substantially increases optical scattering of a least a portion of the primary electromagnetic radiation, the longer output wavelength, or both. In general, the increase of optical scattering by way of the diffusion layer enables homogenization of electromagnetic radiation. In one aspect, the diffusion layer may be disposed between the waveguide and the one or more energy conversion layers, such that the diffusion layer provides homogenization of the primary electromagnetic radiation. Furthermore, the diffusion layer can also act as a diffuse reflector to forward direct at least a portion of the longer output wavelength that would otherwise be emitted in a backward propagating direction. In another aspect, the diffusion layer may be disposed onto a surface of the one or more energy conversion layers and another surface of the one or more energy conversion layers being disposed onto a surface of the waveguide, e.g. the top surface, such that the diffusion layer provides homogenization and mixing of unconverted primary electromagnetic radiation with the at least a portion of radiation emitted by the one or more energy conversion layers, i.e. the longer output wavelength. In addition, the diffusion layer can also redirect radiation that would otherwise become trapped within the one or more energy conversion layers by internal reflection. In these cases, the diffusion layer acts further as a diffuse reflection layer that can redirect at least a portion of the primary electromagnetic radiation and the output wavelength back into the one or more energy conversion layers, thereby increasing the effective optical path length of the one or more energy conversion layers.

The illumination delivery system may also comprise a top protective layer, as previously described, that provides physical and chemical durability for at least the one or more energy conversion layers. The protective layer provides such durability by way of minimizing, if any, damage to the one or more energy conversion layers that may occur as a result of environmental exposure.

Regarding the illumination delivery system of the present teachings, herein and above, the use of the illumination delivery system for generating sustained secondary emission may be utilized in a variety of applications, such as, but not limited to, graphic information displays and artwork, signage, signal or warning lights, and lighting for general illumination. According to one aspect of the present teachings, the use of the illumination delivery system for generating sustained secondary emission can include providing the illumination delivery system, wherein the waveguide transmits at least a portion of the primary electromagnetic radiation provided by the illumination source to that of the one or more energy conversion layers, such that the one or more energy conversion layers subsequently convert at least a portion of the primary electromagnetic radiation to a longer output wavelength.

EXEMPLIFICATIONS

The present teachings, having been generally described, will be more readily understood by reference to the following examples, which are included merely for purposes of illustration of certain aspects and embodiments of the present teachings, and are not intended to limit the scope of these teachings.

Example 1

Preparation of Energy Conversion Layer
(Characterized as 2 in FIG. 2A)-Film A

A formulation containing 48 parts of acrylic copolymer, such as Neocryl® B805, 72 parts toluene, 0.125 parts wetting agent, such as Noresil S-900, and 0.626 parts defoamer, such as Foamex N, was prepared and stirred at room temperature. To this solution was added a solution of 0.086 parts 3-cyanoperylene-9,10-dicarboxylic acid 2',6'-diiosopropylanilide in 4.32 parts dioxalane, and the mixture was stirred until fully dissolved. The formulation was coated on release base at 10 mils or 250 microns wet thickness and dried at 35° C. for 4 hours and then at 80° C. for an additional 12 hours (for ensuring low residual solvent) to yield a 3 mil or 75 micron thick, yellow daylight color film energy conversion layer.

Example 2

Preparation of Stability Enhancement Layer
(Characterized as 6 in FIG. 2A and FIG. 2B)-Film C A formulation containing 20 parts poly(vinyl alcohol) and 230 parts water was prepared and mixed at room temperature, and then heated to 95° C. and slowly stirred for two hours until the solution was clear. The formulation was cooled to room temperature and coated on release base at 10 mils wet thickness, dried at 35° C. for 4 hours and then at 80° C. for 12 hours to yield a 1 mil or 25 microns thick, clear, colorless film.

Example 3

Preparation of Protective Layer (Physical &
Chemical Protection Together with UV Protection
and Other Stabilizing Additives) (Characterized as 8
in FIG. 2A and FIG. 2B)-Film B To 403 parts toluene, 1440 grams 4-chlorobenzotrifluoride, and 820 parts methyl acetate was added 28 parts of UV absorber, such as Tinuvin® 405, and the solution was stirred. To the solution at room temperature was added 1440 parts of acrylate copolymer, such as Neocryl® B805, 173 parts plasticizer, such as Plasthall P-670, 4.3 parts wetting agent, such as Noresil S-900, and 17.3 parts defoamer, such as BYK-085, and the mixture was stirred until the components were fully dissolved. The formulation was coated on a release base at 5 mil wet thickness, and the coatings dried at 35° C. for 12 hours to yield a 2 mil or 50 microns thick, clear, colorless film.

Example 4

Impact of Multilayer Stabilized Energy Conversion Element by Comparison to Non-Stabilized Structures: LED Provides Primary Radiation Source Laminate 1:
Film A was heat laminated at 266° F. to a 10 mil clear polyethylene terephthalate (PET) polyester carrier and the release base was removed to yield an energy conversion element without a stability enhancement layer or a protective layer.

Laminate 2:
A portion of Film B was heat laminated to a portion of Laminate 1 at 266° F. to yield an energy conversion element with a protective layer comprising UV protection.

Laminate 3:
To a second portion of Laminate 1 was heat laminated a portion of Film C using a thermal adhesive. A second portion of Film B was laminated to the top (PVA) surface, to yield an energy conversion element with a stability enhancement layer and a protective layer comprising UV absorbers.

Portions of Laminate 2, and Laminate 3 were subjected to continuous exposure with a deep blue LED (452 nm, 3.6 V, 490 mA) at a distance of 0.5 cm to deliver approximately 420 mW/cm$^2$ to the structure, and monitored for changes in optical absorption of the dye. Optical absorption was followed with a UV/Vis spectrophotometer, and digitized spectra were corrected for optical scatter of the samples. The observations are summarized in FIG. 7. This level of total photonic energy was selected so as to provide an accelerated test for an LED-pumped application. It can be seen that even though the stability enhancement layer is only on one side, there is a significant reduction in the photolytic degradation rate. Without the stability enhancement layer, there is a density loss of greater than 90% in 700 hours, whereas, with the stability layer the density loss is only approximately 10%. It should be noted that when density loss is translated to reduction in the fraction of primary radiation absorbed, the results with the stability enhancement layer are even more striking. With the stability enhancement layer the reduction in primary radiation absorption is less than 2%.

Example 5

Impact of Stabilization Enhancement Layer on the Stability of the Energy Conversion Element by Comparison to Non-Stabilized Structures: Simulated Sunlight Exposure Film D:
An Energy Conversion Layer was similarly prepared as in Example 1 except that the dye was 3,4,9,10-perylenetetracarboxylic acid bis(2,6-diisopropyl)anilide and the polymer was a mixture of 20% polyester plasticizer Plasthall 670 and 80% acrylic polymer Elvacite 2014.

Laminate 4:
Film D was heat laminated at 266° F. to a 3.8 mil white polyester carrier and the release base was removed to yield an energy conversion element without a stability enhancement layer or a protective layer.

Laminate 5:
To a portion of Laminate 4 was laminated a pressure-sensitive adhesive, such as 3M Adhesive Transfer Tape 9626, and a layer of procured oxygen-barrier material, such as Kuraray EF-E15 ethylene vinyl alcohol film to yield an energy conversion element and a stability enhancement layer.

Portions of Laminate 4 and Laminate 5 were subjected to continuous exposure in a sunlight simulator using a full spectrum 1800 W xenon lamp filtered with a Daylight-Q optical filter to deliver an intensity of 600 W/m$^2$ to the samples, and samples were monitored for changes in optical absorption of the dye. Optical absorption was followed with a Gretag Spectrolino reflectance spectrometer. The observations are summarized in FIG. 8. These results show that the use of an oxygen barrier more than doubles the amount of time required to achieve 50% reduction in the peak optical density from ~500 hours to ~1100 hours.

Example 6

Impact of Multilayer Stabilized Energy Conversion Element by Comparison to Non-Stabilized Structures: Simulated Sunlight Exposure Film E:
An Energy Conversion Layer was prepared as in Example 1 except that 3,4,9,10-perylenetetracarboxylic acid bis (2,6-diisopropyl)anilide was used as the dye.

Laminate 6:
Film E was heat laminated at 266° F. to a 10 mil clear polyester carrier and the release base was removed to yield an energy conversion element without a stability enhancement layer or a protective layer.

Laminate 7:
A portion of Film B was heat laminated to a portion of Laminate 6 at 266° F. to yield an energy conversion element with a protective layer comprising UV protection.

Laminate 8:
To a second portion of Laminate 6 was heat laminated a portion of Film C using a thermal adhesive. A second portion of Film B was laminated to the top (PVA) surface, to yield an energy conversion element with a stability enhancement layer and a protective layer comprising UV absorbers.

Portions of Laminate 6, Laminate 7, and Laminate 8 were subjected to continuous exposure in a sunlight simulator using a full spectrum 1800 W xenon lamp filtered with a Daylight-Q optical filter to deliver an intensity of 600 W/m$^2$ to the samples, and samples were monitored for changes in optical absorption of the dye. Optical absorption was followed with a UV/Vis spectrophotometer, and digitized spectra were corrected for optical scatter of the samples. The observations are summarized in FIG. 9. These results show that the use of a UV absorber in a protective layer doubles the time required to achieve 20% reduction in the peak optical density from ~100 hours to ~200 hours. However, with the use of the stability enhancement layer in addition to the protective layer, an 8-fold stability enhancement is observed since the same 20% reduction in dye density is seen only after ~1600 hours of continuous exposure.

Example 7

Conversion of LED Emission Using Multiple Energy Conversion Layers, Stability Enhancement Layer and Protective Layer Film F:
Energy Conversion Layer #1: A formulation containing 7.95 parts acrylic copolymer, such as Neocryl® B-805, 0.0200 parts diisobutyl 4,10-dicyanoperylene-3,9-dicarboxylate, 0.103 parts defoamer, such as Foamex N, 0.0207 parts wetting agent, such as Noresil S-900, 7.95 parts toluene, and 3.99 parts dioxolane were prepared and mixed for 30 minutes at room temperature. The solution was coated on release base at 10 mil or 250 micron wet coating thickness, dried at 35° C. for 12 hour and then at 80° C. for an additional 12 hours, to yield a 3 mil or 75 microns thick, yellow-green film.

Film G:
Energy Conversion Layer #2: A formulation containing 6.958 parts of acrylic copolymer, such as Elvacite 2014, 0.00458 parts 1,6,7,12-tetraphenoxy-N,N'-di(2,6-diisopropylphenyl)-3,4:9,10-perylenediimide, 0.0200 parts wetting agent, such as Noresil S-900, 0.100 parts defoamer, such as Foamex N, 10.835 parts toluene, and 4.589 parts dioxolane were prepared and mixed for 30 minutes at room temperature. The solution was coated on release base at 20 mil or 500 microns wet thickness, dried at 35° C. for 12 hours and then at 80° C. for an additional 12 hours, to yield a 7 mil or 175 microns thick, pink film.

Laminate 9:
Film F, Energy Conversion Layer #1, was heat laminated at 266° F. to a 10 mil clear polyester carrier and the release base removed.

Laminate 10:
Film G, Energy Conversion Layer #2, was laminated to Laminate 9 at 266° F. and its release base removed.

Laminate 11:
Film C, Stability Enhancement layer, was laminated at 266° F. to the top of Laminate 10 using a thermal adhesive.

Laminate 12:
Film B, Protective Layer with photostabilizers, was laminated at 266° F. to the top of Laminate 11 using a thermal adhesive.

Laminate 12 was illuminated with the emission from a deep blue LED operating at 450 nm to give a cool white light. The spectrum of the emission is shown in FIG. 10.

Example 8

Preparation of Multilayer Stabilized Energy Conversion Layer with Selective Reflection Layer for Use with an LED Primary Emission Source Selective reflection films with desired transmissive and reflective properties can be sourced from a number of manufacturers of interference films on a variety of substrates, including polyester sheets. These filters can be constructed entirely of dielectric materials, leading to filters that reflect a significant amount of visible light with low absorption loss. An interference film designed to transmit light at wavelengths less than 470 nm and reflect light greater than 470 nm was obtained to serve as a base material onto which energy conversion layers, such as those described in Example 1, can be coated or laminated, with further stability enhancement layer and protective layers, such as described in Examples 2 and 3, also applied. Such a structure can be pumped with a deep blue LED with an emission wavelength of about 450 nm, to produce a white light emission from the combination of the source LED and converted emissions. By way of example, energy conversion layers were prepared using 3-cyanoperylene-9,10-dicarboxylic acid 2',6'-diisopropylanilide at several different concentrations in Neocryl® B805 resin. A diffusion layer prepared from 18 micron diameter hollow glass spheres dispersed in Neocryl® B805 was laminated to each sample. Each sample was exposed to a deep blue LED source both without and with a selective reflection layer between the source and the sample. The results are shown in Table 3. The results clearly demonstrate the improvement in the amount of forward propagating light collected, with greater effects observed as amount of converted light in the total spectrum increases.

TABLE 3

| Dye Concentration | Emission w/o reflection layer (mW/cm$^2$) | Emission w/ reflection layer (mW/cm$^2$) | Improvement due to reflection layer |
| --- | --- | --- | --- |
| 0.10% | 21.62 | 23.19 | 7% |
| 0.30% | 13.73 | 16.66 | 21% |
| 0.50% | 9.68 | 12.47 | 29% |

Example 9

Preparation of Multilayer Stabilized Energy Conversion of Persistent Phosphor Emission Integrated Phosphor and Energy Conversion Layers The energy conversion of emission from high persistent phosphors was described with examples in US Patent Application Serial Number 2008/0185,557, which is incorporated by reference herein in its entirety and which teaches that fluorescent dyes can be combined with dispersed phosphor in a single layer. The utility of the energy storage and conversion element can be enhanced by including an additional stability enhancement layer and a protective layer that includes a UV absorber. The energy storage and conversion layer can furthermore be prepared on a white or aluminized base substrate to provide additional broadband reflection to maximize front surface emission.

Example 10

Preparation of Multilayer Stabilized Energy Conversion of Persistent Phosphor Emission Laminated Phosphor and Energy Conversion Layers The energy storage and conversion layer described in Example 9 can be constructed in a laminate form by separating the phosphor layer (energy storage) from the energy conversion layer. Furthermore, the energy conversion layer itself can be deconstructed into a series of separate layers, as described in Example 1, each of which perform a step of the desired energy cascade. The energy storage and conversion layers can then be further stabilized as described in Example 9 by the addition of stability enhancement layer and protective layers. The emission from the front surface can be maximized by the use of a reflective substrate, as described in Example 9.

Example 11

Preparation of Multilayer Stabilized Energy Conversion of Chemiluminescent Emission An energy conversion layer, such as described, may be formed into a cylindrical sleeve, such as illustrated in FIG. 6, so as to contain within it a chemiluminescent device, such as a glow stick. The inner and outer surfaces can be coated with materials so as to separately form a stability enhancement layer and a protective layer, to give a multilayer, stabilized cylindrical energy conversion element.

In another embodiment of the present teachings, the multilayer structure can be used as a device for authentication. In one instance, the multilayer structure comprises at least one energy conversion layer and at least one stability enhancement layer. The energy conversion layer comprises one or more photoluminescent materials that converts a primary electromagnetic radiation to a longer output wavelength. The stability enhancement layer increases the photolytic and thermal stability of the energy conversion layer. The multilayer structure may further comprise a reflection layer which redirects radiation emitted in the energy conversion layer, for example in the direction where in may be perceived. The multilayer structure may further comprise a blocking layer that prevents at least a portion of the energy conversion layer from converting the primary electromagnetic radiation to a longer output wavelength. The blocking layer can be rendered as a discrete layer or within the energy conversion layer itself. The blocking layer can be in the form of a transparent polymer film comprising dyes such as, but not limited to Tinuvin® 479, Tinuvin® 327, Tinuvin® 405, and Uvitex OB. The multilayer structure may further comprise an optical variable element that controls the output wavelength emission as a function of viewing angle. The optical variable element can be applied to the multilayer structure in a number of ways, such as, but not limited to, a discrete separate layer or through embossing the surface of at least one layer of the multilayer structure. Examples of optical variable elements include, but not limited to, lenticular films and microprismatic films. The multilayer structure may further comprise a protective layer that enhances durability of at least the energy conversion layer.

Regarding the multilayer structure herein and above, the use of the multilayer structure for authentication can include applying the multilayer structure onto or into at least a portion of an object, wherein the multilayer structure is exposed to a primary electromagnetic energy and an output wavelength emission is detected. Detection of the output wavelength emission can be performed in various ways, such as, but not limited to, visual detection or spectroscopic detection. The use of the multilayer structure may further include comparing the output wavelength emission to a known output wavelength emission associated with the multilayer structure. The multilayer structure can be laminated, thermally or with adhesive, onto any item requiring authentication. In another instance, the energy conversion layer can be applied image-wise using a variety of printing methods including screen printing and ink jet printing. In yet another instance, the blocking layer is applied image-wise so there are areas that block the charging energy and areas that allow the charging energy to charge the phosphor layer. The blocking layer can be applied image-wise using a variety of printing methods including screen printing and ink jet printing.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although the teachings have been described with respect to various embodiments, it should be realized these teachings are also capable of a wide variety of further and other embodiments within the spirit and scope of the appended disclosure.

What is claimed is:

1. An illumination delivery system for generating sustained secondary emission, said illumination delivery system comprising:
   an illumination source that emits a primary electromagnetic radiation,
   a waveguide that receives and propagates said primary electromagnetic radiation, and one or more energy conversion layers that convert at least a portion of said primary electromagnetic radiation to a longer output wavelength, said one or more energy conversion layers comprising a polymer and one or more fluorescent materials having an absorption spectrum that at least partially overlaps with said primary electromagnetic radiation,
   wherein said waveguide transmits at least a portion of said primary electromagnetic radiation to said one or more energy conversion layers.

2. The illumination delivery system of claim 1, wherein one of said one or more energy conversion layers is rendered onto one portion of said waveguide and another one of said one or more energy conversion layers is rendered onto another portion of said waveguide.

3. The illumination delivery system of claim 1, wherein said one or more energy conversion layers further comprise at least one of one or more wetting agents, one or more liquid carrier mediums, one or more dispersant agents, one or more deaerating agents, one or more rheology modifiers, or one or more photostabilizers.

4. The illumination delivery system of claim 3, wherein said one or more energy conversion layers having an optical transmission of at least equal to about 95 percent.

5. The illumination delivery system of claim 1, wherein said illumination source is at least one of a chemiluminescent source, a laser, an electroluminescent source, a solid state device, or one or more photoluminescent materials.

6. The illumination delivery system of claim 1, wherein said one or more energy conversion layers being rendered onto at least a portion of a surface of said waveguide that transmits said primary electromagnetic radiation.

7. The illumination delivery system of claim 1, wherein said one or more energy conversion layers being positioned over at least a surface of said waveguide that is remote to said illumination source.

8. The illumination delivery system of claim 1, wherein at least a portion of a surface of said waveguide is roughened to extract said primary electromagnetic radiation from said waveguide, said surface being remote to said illumination source.

9. The illumination delivery system of claim 1, wherein said one or more energy conversion layers being optically coupled to said waveguide.

10. The illumination delivery system of claim 1, wherein said one or more energy conversion layers being optically decoupled to said waveguide.

11. The illumination delivery system of claim 1, wherein said one or more energy conversion layers further comprise one or more light scattering materials that disperse at least a portion of radiation, the radiation being at least one of said primary electromagnetic radiation or said longer output wavelength emitted from said one or more energy conversion layers.

12. The illumination delivery system of claim 1, further comprising a reflection layer that redirects at least a portion of radiation to the viewing hemisphere, the radiation being at least one of said primary electromagnetic radiation or said longer output wavelength.

13. The illumination delivery system of claim 12, wherein said reflection layer being rendered onto a surface of said waveguide and said one or more energy conversion layers being rendered onto another surface of said reflection layer.

14. The illumination delivery system of claim 12, wherein said reflection layer being rendered onto a surface of said waveguide and said one or more energy conversion layers being rendered onto an opposing surface of said waveguide.

15. The illumination delivery system of claim 12, wherein said reflection layer comprises a plurality of alternate layers of non-metallic materials having high and low dielectric constants.

16. The illumination delivery system of claim 12, wherein said reflection layer is a lenticular or a microprismatic element.

17. The illumination delivery system of claim 1, further comprising a diffusion layer that substantially increases optical scattering of at least a portion of radiation, the radiation being at least one of said primary electromagnetic radiation or said longer output wavelength.

18. The illumination delivery system of claim 1, further comprising a protective layer that provides physical and chemical durability for at least said one or more energy conversion layers.

19. The illumination delivery system of claim 1, wherein said primary electromagnetic radiation having wavelengths being at least one of visible or ultraviolet.

20. The illumination delivery system of claim 1, wherein said longer output wavelength is at least one of infrared, visible, or ultraviolet.

21. A method for generating sustained secondary emission, said method comprising:
providing an illumination delivery system for generating sustained secondary emission, said illumination delivery system comprising:
(i) an illumination source that emits a primary electromagnetic radiation,
(ii) a waveguide that receives and propagates said primary electromagnetic radiation, and
(iii) one or more energy conversion layers comprising a polymer and one or more fluorescent materials having an absorption spectrum that at least partially overlaps with said primary electromagnetic radiation,
wherein said waveguide transmits at least a portion of said primary electromagnetic radiation to said one or more energy conversion layers, such that said one or more energy conversion layers subsequently convert at least a portion of said primary electromagnetic radiation to a longer output wavelength.

22. The method of claim 21, wherein one of said one or more energy conversion layers is rendered onto one portion of said waveguide and another one of said one or more energy conversion layers is rendered onto another portion of said waveguide.

23. The method of claim 21, wherein said one or more energy conversion layers further comprise at least one of one or more wetting agents, one or more liquid carrier mediums, one or more dispersant agents, one or more deaerating agents, one or more rheology modifiers, or one or more photostabilizers.

24. The method of claim 23, wherein said one or more energy conversion layers having an optical transmission of at least equal to about 95 percent.

25. The method of claim 21, wherein said illumination source is at least one of a chemiluminescent source, a laser, an electroluminescent source, a solid state device, or one or more photoluminescent materials.

26. The method of claim 21, wherein said one or more energy conversion layers being rendered onto at least a portion of a surface of said waveguide that transmits said primary electromagnetic radiation.

27. The method of claim 21, wherein said one or more energy conversion layers being positioned over at least a surface of said waveguide that is remote to said illumination source.

28. The method of claim 21, wherein at least a portion of a surface of said waveguide is roughened to extract said primary electromagnetic radiation from said waveguide, said surface being remote to said illumination source.

29. The method of claim 21, wherein said one or more energy conversion layers is optically coupled to said waveguide.

30. The method of claim 21, wherein said one or more energy conversion layers being optically decoupled to said waveguide.

31. The method of claim 21, wherein said one or more energy conversion layers further comprise one or more light scattering materials that disperse at least a portion of radiation, the radiation being at least one of said primary electromagnetic radiation or said longer output wavelength emitted from said one or more energy conversion layers.

32. The method of claim 21, wherein said illumination delivery system further comprises a reflection layer that redirects at least a portion of radiation to the viewing hemisphere, the radiation being at least one of said primary electromagnetic radiation or said longer output wavelength.

33. The method of claim 32, wherein said reflection layer being rendered onto a surface of said waveguide and said one or more energy conversion layers being rendered onto another surface of said reflection layer.

34. The method of claim 32, wherein said reflection layer being rendered onto a surface of said waveguide and said one or more energy conversion layers being rendered onto an opposing surface of said waveguide.

35. The method of claim 32, wherein said reflection layer comprises a plurality of alternate layers of non-metallic materials having high and low dielectric constants.

36. The method of claim 32, wherein said reflection layer is a lenticular or a microprismatic element.

37. The method of claim 21, wherein said illumination delivery system further comprises a diffusion layer that substantially increases optical scattering of at least a portion of radiation, the radiation being at least one of said primary electromagnetic radiation or said longer output wavelength.

38. The method of claim 21, wherein said illumination delivery system further comprises a protective layer that provides physical and chemical durability for at least said one or more energy conversion layers.

39. The method of claim 21, wherein said primary electromagnetic radiation having wavelengths being at least one of visible or ultraviolet.

40. The method of claim 21, wherein said longer output wavelength is at least one of infrared, visible, or ultraviolet.

\* \* \* \* \*